(12) United States Patent
Olsson et al.

(10) Patent No.: US 9,641,154 B2
(45) Date of Patent: May 2, 2017

(54) SINGLE CRYSTAL MICROMECHANICAL RESONATOR

(71) Applicant: Sandia Corporation, Albuquerque, NM (US)

(72) Inventors: Roy H. Olsson, Albuquerque, NM (US); Thomas A. Friedmann, Albuquerque, NM (US); Sara Jensen Homeijer, Albuquerque, NM (US); Michael Wiwi, Albuquerque, NM (US); Khalid Mikhiel Hattar, Albuquerque, NM (US); Blythe Clark, Albuquerque, NM (US); Todd Bauer, Albuquerque, NM (US); Stuart B. Van Deusen, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 15/349,593

(22) Filed: Nov. 11, 2016

(65) Prior Publication Data

US 2017/0054432 A1   Feb. 23, 2017

Related U.S. Application Data

(62) Division of application No. 14/288,236, filed on May 27, 2014, now Pat. No. 9,525,398.

(51) Int. Cl.
| | |
|---|---|
| H03H 9/54 | (2006.01) |
| H03H 3/02 | (2006.01) |
| H03H 9/02 | (2006.01) |
| H03H 9/17 | (2006.01) |
| H03H 9/205 | (2006.01) |

(52) U.S. Cl.
CPC ............ *H03H 9/54* (2013.01); *H03H 3/02* (2013.01); *H03H 9/02228* (2013.01); *H03H 9/17* (2013.01); *H03H 9/205* (2013.01); *H03H 2003/027* (2013.01)

(58) Field of Classification Search
None
See application file for complete search history.

(56) References Cited

U.S. PATENT DOCUMENTS

| | | |
|---|---|---|
| 7,385,334 B1 | 6/2008 | Olsson et al. |
| 7,616,077 B1 | 11/2009 | Wittwer et al. |
| 7,652,547 B1 | 1/2010 | Wittwer et al. |
| 7,733,198 B1 | 6/2010 | Olsson et al. |
| 7,836,566 B1 | 11/2010 | Olsson et al. |
| 7,859,350 B1 | 12/2010 | Schwindt et al. |
| 8,094,023 B1 | 1/2012 | El-Kady et al. |
| 8,367,305 B1 | 2/2013 | Wojciechowski et al. |
| 8,466,754 B1 | 6/2013 | Olen et al. |

(Continued)

OTHER PUBLICATIONS

Abdolvand R et al., "Thin-film piezoelectric-on-silicon resonators for high-frequency reference oscillator applications," *IEEE Trans. Ultrason. Ferroelect. Freq. Contr.* Dec. 2008;55(12):2596-606.

(Continued)

*Primary Examiner* — Scott B Geyer
(74) *Attorney, Agent, or Firm* — Martin I. Finston

(57) ABSTRACT

A single crystal micromechanical resonator includes a suspended plate of lithium niobate or lithium tantalate. The suspended plate and a support structure are formed from a single crystal.

6 Claims, 15 Drawing Sheets

(56) References Cited

U.S. PATENT DOCUMENTS

| | | | |
|---|---|---|---|
| 8,497,747 | B1 | 7/2013 | Wojciechowski et al. |
| 8,508,370 | B1 | 8/2013 | El-Kady et al. |
| 8,522,411 | B1 | 9/2013 | Bouche et al. |
| 8,525,619 | B1 | 9/2013 | Olsson et al. |
| 8,597,985 | B1 | 12/2013 | Chanchani et al. |
| 8,600,200 | B1 | 12/2013 | Rakich et al. |
| 8,669,823 | B1 | 3/2014 | Olsson et al. |
| 8,689,426 | B2 | 4/2014 | Thalmayr et al. |
| 2010/0320475 | A1 | 12/2010 | Speck et al. |
| 2011/0250397 | A1 | 10/2011 | Wang et al. |
| 2014/0210315 | A1* | 7/2014 | Bhattacharjee ......... H03H 9/17 310/348 |

OTHER PUBLICATIONS

Aigner R, "MEMS in RF filter applications: thin-film bulk acoustic wave technology," *Sensors Update* Feb. 2003;12(1):175-210.

Aigner R, "SAW and BAW technologies for RF filter applications: A review of the relative strengths and weaknesses," *Proc. 2008 IEEE Ultrason. Symp.* held Nov. 2-5, 2008, in Beijing, China, pp. 582-589.

Aspar B et al., "The generic nature of the Smart-Cut® process for thin film transfer," *J. Electron. Mater.* Jul. 2001;30(7):834-40.

Benes E et al., "Comparison between BAW and SAW sensor principles," *IEEE Trans. Ultrason. Ferroelect. Freq. Contr.* Sep. 1998;45(5):1314-30.

Bi FZ et al., "Bulk acoustic wave RF technology," *IEEE Microwave Mag.* Oct. 2008;9(5):65-80.

Bianconi M etal., "Modification of the etching properties of X-cut lithium niobate by ion implantation," *Nucl. Inst. Methods Phys. Res. B* 2008;266:1238-41.

Campbell CK, "Applications of surface acoustic and shallow bulk acoustic wave devices," *Proc. IEEE* Oct. 1989t;77(10):1453-84.

Casinovi G et al., "Lamb waves and resonant modes in rectangular-bar silicon resonators," *J. Microelectromech. Sys.* Aug. 2010;19(4):827-39.

Deguet C et al., "LiNbO$_3$ single crystal layer transfer techniques for high performances RF filters," *ECS Trans.* 2010;33(4):225-32.

Gong S et al., "Design and analysis of lithium—niobate-based high electromechanical coupling RF-MEMS resonators for wideband filtering," *IEEE Trans. Microwave Theory Tech.* Jan. 2013;61(1):403-14.

Kadota M et al., "High-frequency Lamb wave device composed of MEMS structure using LiNbO$_3$ thin film and air gap," *IEEE Trans. Ultrason. Ferroelectr. Freq. Control* Nov. 2010;57(11):2564-71.

Kadota M et al., "Wide band resonators using SH mode of plate wave on LiNbO$_3$," *Proc. 2012 IEEE Ultrason. Symp.* held Oct. 7-10, 2012 in Dresden, Germany, pp. 563-567.

Kadota M, "Development of substrate structures and processes for practical applications of various surface acoustic wave devices," *Jpn. J. Appl. Phys.* Jun. 2005;44(6B):4285-91.

Kim B et al, "AIN microresonator-based filters with multiple bandwidths at low intermediate frequencies," *J. Microelectromech. Sys.* Aug. 2013;22(4):949-61.

Kim B et al., "Ovenized and thermally tunable aluminum nitride microresonators," *Proc. 2010 IEEE Ultrason. Symp. (IUS)*, held on Oct. 11-14, 2010 in San Diego, CA, pp. 974-978.

Kovacs G et al., "Improved material constants for LiNbO$_3$ and LiTaO$_3$," *Proc. 1990 IEEE Ultrason. Symp.* held Dec. 4-7, 1990 in Honolulu, HI, vol. 1, pp. 435-438.

Kuznetsova IE et al., "Investigation of acoustic waves in thin plates of lithium niobate and lithium tantalate," *IEEE Trans. Ultrason. Ferroelect. Freq. Contr.* Jan. 2001;48(1):322-8.

Lakin KM, "A review of thin-film resonator technology," *IEEE Microwave Mag.* Dec. 2003;4(4):61-7.

Lin CM et al., "Temperature-compensated aluminum nitride Lamb wave resonators," *IEEE Trans. Ultrason. Ferroelect. Freq. Contr.* Mar. 2010;57(3):524-32.

Malocha DC, "SAW/BAW acoustoelectronic technology for filters and communication systems," *Proc. 2010 IEEE 11th Annu. Wireless & Microwave Technol. Conf. (WAMICON)*, held on Apr. 12-13, 2010 in Melbourne, FL, pp. 1-7.

Moulet JS et al., "High piezoelectric properties in LiNbO$_3$ transferred layer by the Smart Cut™ technology for ultra wide band BAW filter applications," *Proc. 2008 IEEE Int'l Electron. Devices Meeting*, held Dec. 15-17, 2008 in San Francisco, CA, pp. 1-4.

Nguyen CTC, "MEMS technology for timing and frequency control," *IEEE Trans. Ultrason. Ferroelect. Freq. Contr.* Feb. 2007;54(2):251-70.

Olsson III RH et al., "A high electromechanical coupling coefficient SH0 Lamb wave lithium niobate micromechanical resonator and a method for fabrication," *Sens. Actuat. A* Mar. 2014;209:183-90.

Olsson III RH et al., "Microresonator filters and frequency references," R&D 100 submission (Sandia No. SAND2011-1652P), 2011 (pp. 25).

Piazza G et al. "Single-chip multiple-frequency AlN MEMS filters based on contour-mode piezoelectric resonators," *J. Microelectromech. Sys.* Apr. 2007;16(2):319-28.

Piazza G et al., "Piezoelectric aluminum nitride thin films for microelectromechanical systems," *MRS Bull.* Nov. 2012;37(11):1051-61.

Pulskamp JS et al., "Piezoelectric PZT MEMS technologies for small-scale robotics and RF applications," *MRS Bull.* Nov. 2012;37(11):1062-70.

Randles AB et al., "Etch rate dependence on crystal orientation of lithium niobate," *IEEE Trans. Ultrason. Ferroelect. Freq. Contr.* Nov. 2010;57(11):2372-80.

Reinisch J et al., "Etching of ion irradiated LiNbO$_3$ in aqueous hydrofluoric solutions," *J. Electrochem. Soc.* Feb. 2008;155(4):D298-D301.

Ruby R et al., "PCS 1900 MHz duplexer using thin film bulk acoustic resonators (FBARs)," *Electron. Lett.* May 1999;35(10):794-5.

Si G et al., "Suspended slab and photonic crystal waveguides in lithium niobate," *J. Vac. Sci. Technol. B* Mar. 2010;28(2):316-20.

Wang R et al., "High $k_t^2_xQ$, multi-frequency lithium niobate resonators," *Proc. 2013 IEEE 26th Int'l Conf. Micro Electro Mechanical Systems (MEMS)*, held Jan. 20-24, 2013 in Taipei, Taiwan, pp. 165-168.

Wang R et al., "Thin-film lithium niobate contour-mode resonators," *Proc. 2012 IEEE Int'l Ultrason. Symp. (IUS)*, held on Oct. 7-10, 2012, in Dresden, Germany, pp. 303-306.

Weinstein D et al., "Internal dielectric transduction in bulk-mode resonators," *J. Microelectromech. Sys.* Dec. 2009;18(6):1401-8.

Yantchev V et al., "Thin film Lamb wave resonators in frequency control and sensing applications: a review," *J. Micromech. Microeng.* 2013;23:043001 (14 pp.).

Yu YC et al., "Crystal ion-slicing lithium niobate film performed by 250 keV $^4$He ion implantation," *Nucl. Instr. Meth. Phys. Res. B*, Mar. 2007;256(1):558-60.

\* cited by examiner ized by ion implantation of
SINGLE CRYSTAL MICROMECHANICAL RESONATOR

CROSS-REFERENCE TO RELATED APPLICATION

This application is a divisional of prior U.S. application Ser. No. 14/288,236, filed May 27, 2014, entitled "SINGLE CRYSTAL MICROMECHANICAL RESONATOR AND FABRICATION METHODS THEREOF" which is incorporated herein by reference in its entirety.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to a single crystal micromechanical resonator and microfabrication methods thereof. In particular, the resonator is formed by ion implantation of a lithium niobate or lithium tantalate single crystal.

BACKGROUND OF THE INVENTION

Micromechanical resonators (or microresonators) are miniature acoustic resonators fabricated using integrated circuit microfabrication techniques. Such microresonators have various uses, such as filters and oscillators. In particular, the resonant frequency can be defined photolithographically, thereby allowing numerous filters spanning from several hundred MHz to several GHz to be realized on a single chip.

Currently, band select filters in cellular handsets are realized using a combination of many dies containing bulk (BAW) or surface (SAW) acoustic wave resonators. The resonant frequency for these BAW resonators is determined generally by the thickness of a deposited thin film and requires a separate film thickness for each filter frequency. This makes integration of multiple frequency filters on a single die both challenging and costly. While in theory SAW resonators can support a wide range of frequencies on a single chip, in practice, the thickness of the metal interdigitated electrodes used to transduce a SAW resonator is varied with frequency, thereby limiting the range of filter bands that can be covered on a single chip.

By basing the resonance on a laterally propagating Lamb wave in a suspended plate with a thickness less than an acoustic wavelength, a wide range of filter frequencies can be achieved on a single wafer by altering the CAD-layout of the devices. Piezoelectric Lamb wave resonators formed in deposited thin films of aluminum nitride, zinc oxide, and lead zirconate titanate, while having much higher coupling coefficients than electrostatically transduced microresonators, still do not have a high enough coupling coefficient for many of the band select filters in wireless handsets. Thus, there is a need for improved microresonators having sufficiently high coupling coefficients and CAD-definable frequencies, as well as new methods for fabricating such microresonators on a single chip.

SUMMARY OF THE INVENTION

Accordingly, the present invention relates to a Lamb wave microresonator having a resonant frequency defined by the plate width W, which is a photolithographically definable dimension of the device. The present invention also provides other lithographically definable resonator and electrode dimensions (e.g., any dimension described herein, such as resonator plate thickness t or electrode aperture a) that can be optimized to provide desired device characteristics.

In particular embodiments, the microresonator of the invention has numerous improved characteristics, such as a high coupling coefficient $k_{\textit{eff}}^2$, a high quality factor Q, and a high resonator figure of merit FOM. Such characteristics can be improved, e.g., by matching the crystal orientation with the type of plate acoustic wave (e.g., SH0 or S0) having the highest electromechanical coupling coefficient $K^2$ or $k_{\textit{eff}}^2$ for that orientation, by controlling the electrode spacing or aperture a, by arraying numerous resonators in parallel, as well as any other design considerations described herein.

Also described herein are methods of fabricating such microresonators in a single crystal in crystallographic class 3m (e.g., lithium niobate or lithium tantalate). The method includes forming a damaged layer beneath the top surface of the crystal, providing at least one trench to access that damaged layer, and then removing the damaged layer with an etchant. In this manner, the resonating portion, the support structure, and the anchoring regions configured to suspend the resonating portion are formed within the same single crystal. In particular, the methods of the invention do not require costly wafer bonding, polishing, or fracturing processes.

In a first aspect, the invention features a method for fabricating a micromechanical resonator, the method including: (i) providing a single 3m crystal (e.g., lithium niobate or lithium tantalate); (ii) treating an exposed area of the single crystal with ions, thereby creating an ion damaged region below the top surface of the crystal; (iii) providing at least one trench that defines a first dimension of the resonator; and (iv) removing the ion damaged layer with an etchant. In some embodiments, the method thereby releases at least a resonating portion of the resonator from the crystal.

In some embodiments, the method includes, before step (ii), patterning a top surface of the crystal with a mask, thereby defining the exposed area. In other embodiments, the mask includes a plurality of exposed areas. In further embodiments, each exposed area defines a resonating portion of a resonator, thereby providing a plurality of micromechanical resonators on a single die. In yet other embodiments, two or more of the plurality of micromechanical resonators are the same or different.

In some embodiments, the method includes, before step (iv), depositing a protective layer on the first dimension of the resonator. In further embodiments, the method includes stripping the protective layer (e.g., after step (iv)).

In other embodiments, the method includes, after step (i), depositing a metal layer on a top surface of the crystal, where the mask is then patterned on top of the metal layer. In further embodiments, the method includes patterning the metal layer with one or more electrodes.

In some embodiments, the method includes, after step (iv), annealing the resonator (e.g., thereby healing the ion damaged layer).

In some embodiments, the crystal is an X-cut lithium niobate crystal, a Y-cut lithium niobate crystal, a Z-cut lithium niobate crystal, a rotated cut lithium niobate crystal, an X-cut lithium tantalate crystal, a Y-cut lithium tantalate crystal, a Z-cut lithium tantalate crystal, or a rotated-cut lithium tantalate crystal (e.g., a rotated X-, Y-, or Z-cut crystal, where the rotation can be of any useful angle, such as 136°).

In other embodiments, the resonator is a shear mode Lamb wave resonator or a symmetric mode Lamb wave resonator.

In some embodiments, the ion is helium or hydrogen.

In a second aspect, the invention features a single crystal micromechanical resonator including a resonating portion that includes a single X-cut or Y-cut crystal of lithium niobate or lithium tantalate; a support structure disposed below the resonating portion, where the resonating portion and the support structure are composed of the same single X-cut or Y-cut crystal; and a plurality of anchoring regions configured to suspend the resonating portion within the support structure, where a trench is disposed below and/or around the resonating portion.

In some embodiments, the plurality of anchoring regions, resonating portion, and the support structure are composed of the same single X-cut or Y-cut crystal.

In other embodiments, the resonator further includes a plurality of electrodes disposed on a surface of the resonating portion. In yet other embodiments, the resonating portion includes a suspended plate.

In a third aspect, the invention features a die including a plurality of single crystal micromechanical resonators (e.g., any described herein). In some embodiments, two or more resonators are the same or different.

In a fourth aspect, the invention features a band select filter array including a plurality of single crystal micromechanical resonators (e.g., any described herein). In some embodiments, two or more resonators are the same or different.

Definitions

As used herein, the term "about" means +/−10% of any recited value. As used herein, this term modifies any recited value, range of values, or endpoints of one or more ranges.

By "micro" is meant having at least one dimension that is less than 1 mm. For instance, a microresonator can have a length, width, height, cross-sectional dimension, circumference, radius (e.g., external or internal radius), or diameter that is less than 1 mm.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

BRIEF DESCRIPTION OF THE DRAWINGS

In FIG. 5B, the optional Au layer was used to protect the −z face of the LiNbO₃ microresonator sidewall.

DETAILED DESCRIPTION OF THE INVENTION

The present invention relates to a micromechanical resonator (or microresonator) having a high coupling coefficient $k_{eff}^2$. In particular, the resonator includes a resonating portion, one or more electrodes disposed on at least one surface of the resonating portion, and a support structure disposed below the resonating portion. In further embodiments, the resonating portion includes one or more anchoring regions, which suspend the resonating portion within the support structure. In yet other embodiments, the suspended resonating portion is surrounded by a trench, which separates the resonating portion and the support structure. Additional details of all these components are described herein.

Figure 1A:
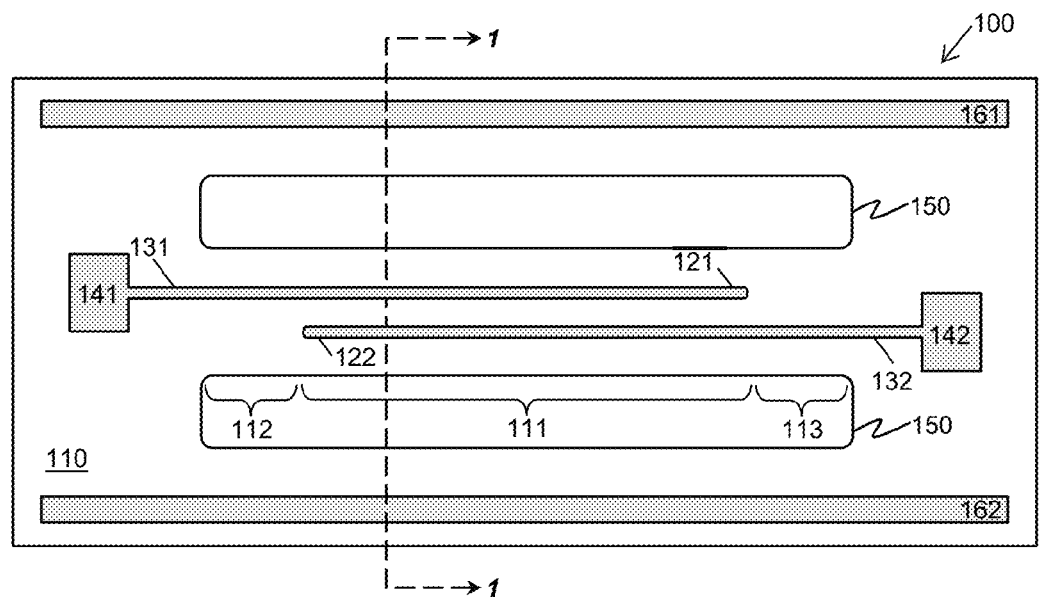
FIG. 1A-1C shows schematics of an exemplary microresonator. Provided are (A) an exemplary microresonator 100 having a plate suspended over a trench 150, (B) a cross section view along section line 1-1, and (C) a perspective view showing various dimensions of the microresonator, including width W, length L, and thickness t of the resonating portion, as well as electrode gap g, electrode aperture a, electrode width e, and space between the electrode and the edge of the resonating portion s.
Figure 1B:
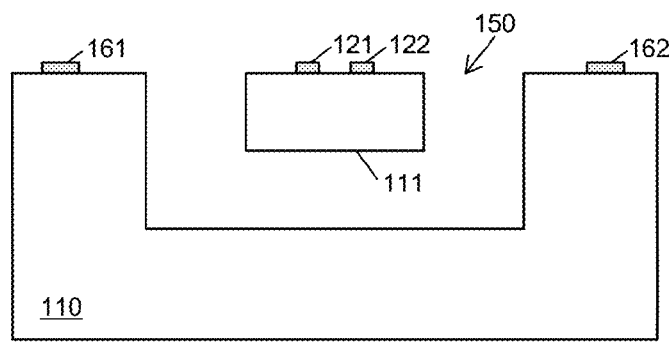

FIG. 1A-1B shows an exemplary microresonator. As seen in FIG. 1A, the microresonator 100 includes a resonating portion 111 and two anchoring region 112, 113 configured to suspend the resonating portion 111 within the support structure 110. A pair of electrodes 121, 122 on the top surface of the resonating portion 111 is electrically connected to contact pads 141, 142 by wiring 131, 132. Ground electrodes 161, 162 are also disposed on the top face of the microresonator 100. The electrodes can have any useful geometry (e.g., bars, interdigitated fingers, etc.) and useful location (e.g., on the top and/or bottom surfaces of the microresonator, resonating portion, and/or anchoring region(s)).

The resonating portion can be suspended. For example, the microresonator 100 includes a trench 150, which is located between the bottom surface of the resonating portion 111 and a surface of the support structure 110. As seen in FIG. 1B, the trench 150 is disposed below and around the resonating portion 111. In this manner, the trench 150 acoustically isolates the suspended resonating portion 111 from the support structure 110. Additional isolation trenches can be included in the support structure.

Figure 1C:
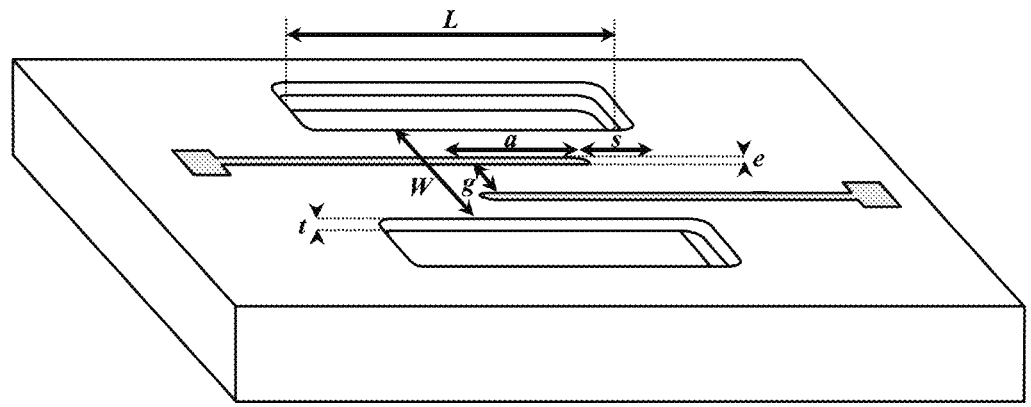

The resonating portion generally includes a single crystal of a piezoelectric material having any useful crystallographic cut (e.g., any described herein). The dimension(s) of the resonating portion can be selected to optimize the coupling coefficient $k_{eff}^2$, the resonant frequency $f_s$, and/or the quality factor Q. Exemplary dimensions include plate thickness t, width W, and length L (FIG. 1C). For instance, to promote particular modes within the resonator (e.g., the SH0 or S0 mode), the thickness-to-wavelength ratio $t/\lambda$ can be about 0.05. The width W can be designed to for a particular wavelength $\lambda$ (e.g., $\lambda=2$ W for a Lamb wave resonator) or for a particular resonant frequency $f_s=c/2$ W, where c is the relevant sound velocity.

The anchoring region(s) connect the resonating portion to the support structure. In addition, the anchoring regions can be designed to suspend and isolate the resonating region. For instance, the microresonator can include thin, tapered anchoring regions that suspend the resonating portion above a trench that is located within the substrate or support structure. Exemplary structures for anchoring regions are described in U.S. Pat. No. 8,669,823, which is incorporated herein by reference in its entirety.

In another instance, the resonating region can be a rectangular region having four corners, and an anchoring region can be located on each of the corners to connect and suspend the resonating region above a trench (see, e.g., Gong S et al., "Design and analysis of lithium-niobate-based high electromechanical coupling RF-MEMS resonators for wideband filtering," *IEEE Trans. Microwave Theory Tech.* 2013 January; 61(1):403-14). Other design and material considerations can be incorporated into the geometry of the anchoring region in order to promote acoustic and/or thermal isolation.

One or more electrodes can be used to drive and/or sense the acoustic waves in the piezoelectric crystal. The electrode(s) can have any useful dimension and/or orientation. For instance, the electrode can have any useful electrode width e (e.g., about 5 μm), gap g between two electrodes (e.g., about 5 μm), aperture a (e.g., from about 20 μm to about 200 μm), and space s (e.g., from about 20 μm to about 200 μm) (FIG. 1C). The electrode can be placed at any useful location of the resonating portion, such as on the top surface and/or at or near the edge of the resonating portion. Additional electrodes can be included (e.g., one or more ground electrodes, opposite polarity electrodes, or floating electrodes) on one or more surfaces of the resonating portion (e.g., the top and/or bottom surfaces) and/or the anchoring region(s).

The electrode can be electrically connected (e.g., by wiring) to one or more bond pads (e.g., contact pads and/or ground pads) to provide electrical input and output connections for the microresonator. Exemplary electrodes include an interdigitated transducer, a grating electrode, a thin film electrode, and/or a floating electrode having any useful thickness, period, material, or geometric arrangement and formed by any useful process, such as sputtering, vacuum deposition, or ion-plating. Exemplary electrodes are described in U.S. Pat. Nos. 8,497,747 and 8,522,411, each of which is incorporated herein by reference in its entirety. Non-limiting materials for electrodes include aluminum (Al), titanium (Ti), gold (Au), copper (Cu), tungsten (W), molybdenum (Mo), platinum (Pt), ruthenium (Ru), tantalum (Ta), chromium (Cr), osmium (Os), rhenium (Re), iridium (Ir), as well as alloys, doped forms, and multilayers thereof (e.g., TiW/AlCu or TiW/Cu layers). Arrays of n electrodes or n pairs of electrodes (e.g., n is 2, 4, 5, 10, 15, 20, 24, etc.) can also be incorporated with the microresonator of the invention. In particular embodiments, the electrode includes a lower resistive material to improve the quality factor and/or to operate at higher frequencies (e.g., any lower resistive material described herein, such as gold, silver, copper, aluminum, as well as doped forms thereof).

The present method can be used to form any useful resonator. Exemplary resonators includes a Lamb wave resonator having a plate resonating portion; a thickness mode acoustic wave resonator having longitudinal elastic waves traveling though the solid material; a contour mode resonator having a suspended resonating portion; as well as thickness-field excitation and lateral field excitation resonators thereof. In addition, the resonator can be optimized to promote symmetric modes, asymmetric modes, and/or shear modes of the acoustic wave propagating in the piezoelectric crystal. Spurious modes can be reduced by any useful method, such as by rotating bond/contact pads.

Additional microresonators (e.g., length-extensional resonators, contour mode resonators, thickness mode resonators, ring resonators, and bar resonators) and anchoring region designs are described in U.S. Pat. Nos. 7,652,547, 8,367,305, and 8,669,823; Wang R et al., "Thin-film lithium niobate contour-mode resonators," *Proc.* 2012 *IEEE Int'l Ultrason. Symp.* (*IUS*), held on 7-10 Oct. 2012, in Dresden, Germany, pp. 303-6; and Kadota M et al., "High-frequency Lamb wave device composed of MEMS structure using LiNbO$_3$ thin film and air gap," *IEEE Trans. Ultrason. Ferroelectr. Freq. Control* 2010 November; 57(11):2564-71, each of which is incorporated herein by reference in its entirety.

Single Crystal

The present invention includes microresonators and methods that employ a piezoelectric crystal. In particular embodiments, the crystal is of crystallographic class 3m, such as lithium niobate or lithium tantalate.

Single crystals are available as plate cuts along a particular crystallographic axis or axes. Fundamental acoustic waves propagate differently through different plate cuts. For instance, in an X-cut lithium niobate plate, shear SH0 waves with a propagation direction that is 170° from they-axis have a coupling coefficient $K^2$ of about 38. In contrast, for that same X-cut plate and propagation direction, asymmetric A0 waves have a coupling coefficient $K^2$ of about 0.8. In another instance, in a Y-cut lithium niobate plate, SH0 waves with a propagation direction that is 0° from the x-axis have a coupling coefficient $K^2$ of about 35. In contrast, for that same Y-cut plate and propagation direction, A0 waves have a coupling coefficient $K^2$ of about 4. Accordingly, the particular cut of a single crystal, as well as the propagation direction (e.g., as controlled by the geometry and arrangement of the driving electrodes), provide microresonators having different modes and coupling coefficients.

Figure 2:
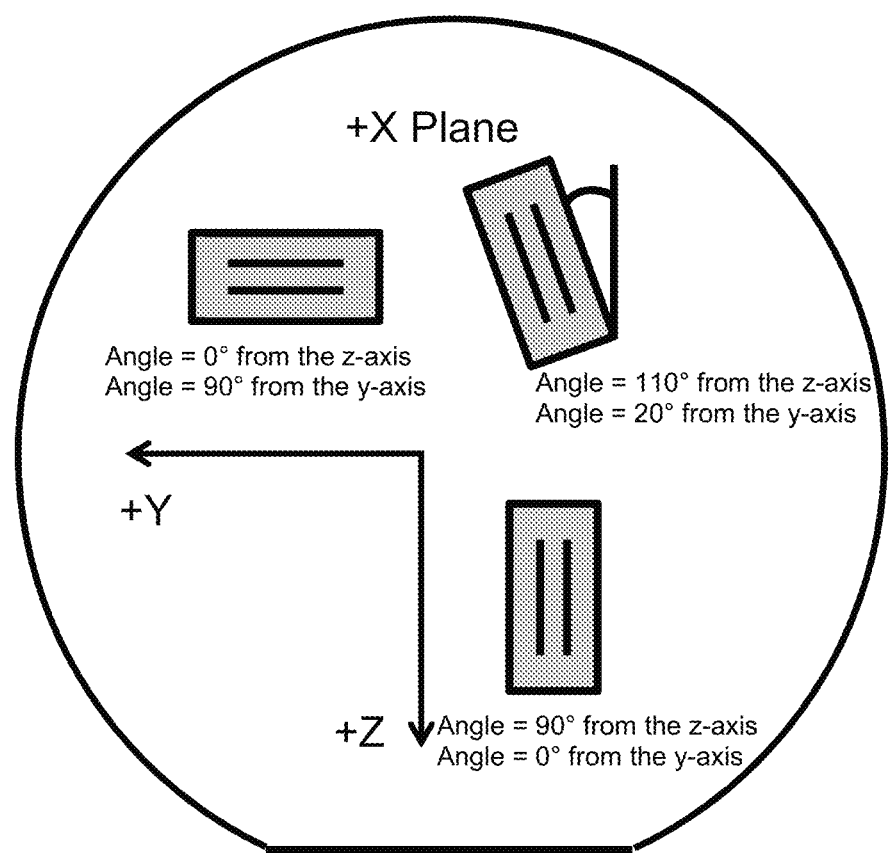
FIG. 2 is a top down schematic of an X-cut LiNbO₃ wafer showing the z- and y-crystal planes. Gray rectangles represent the microresonator having two electrodes (parallel black lines). Shown are angles of acoustic propagation relative to the z- or y-axis. The coupling coefficient and sound velocity for each Lamb mode vary with the direction of acoustic propagation.

Exemplary cuts include X-cut, Y-cut, and Z-cut plates, as well as rotated cuts. Within these cuts, the acoustic wave propagates at a particular angle from an axis. For example, FIG. 2 provides a schematic of an X-cut single crystal having wave propagation directions relative to the z-axis or they-axis. Based on the location and arrangement of the electrodes, the propagation direction of the acoustic wave can be controlled.

Methods of Fabrication

The present invention includes methods for fabricating a single crystal microresonator. In particular, the method relies on ion implantation to fracture a sub-surface portion of the single crystal and on subsequent use of an etchant to remove that sub-surface portion. In this way, one dimension of the isolated resonating portion (i.e., thickness t) can be determined lithographically. This method allows other dimensions of the resonating portion (e.g., W and L dimensions) and electrodes (e.g., a, g, and e dimensions) to be determined lithographically. As described herein, these dimensions contribute to various physical characteristics of the microresonator, such as $f_s$, $k_{eff}^2$, Q, and FOM. The ability to control these physical characteristics using lithography provides numerous benefits, such as the ability to form multiple frequency filters on a single die. Additional details are described herein.

Figure 3A:
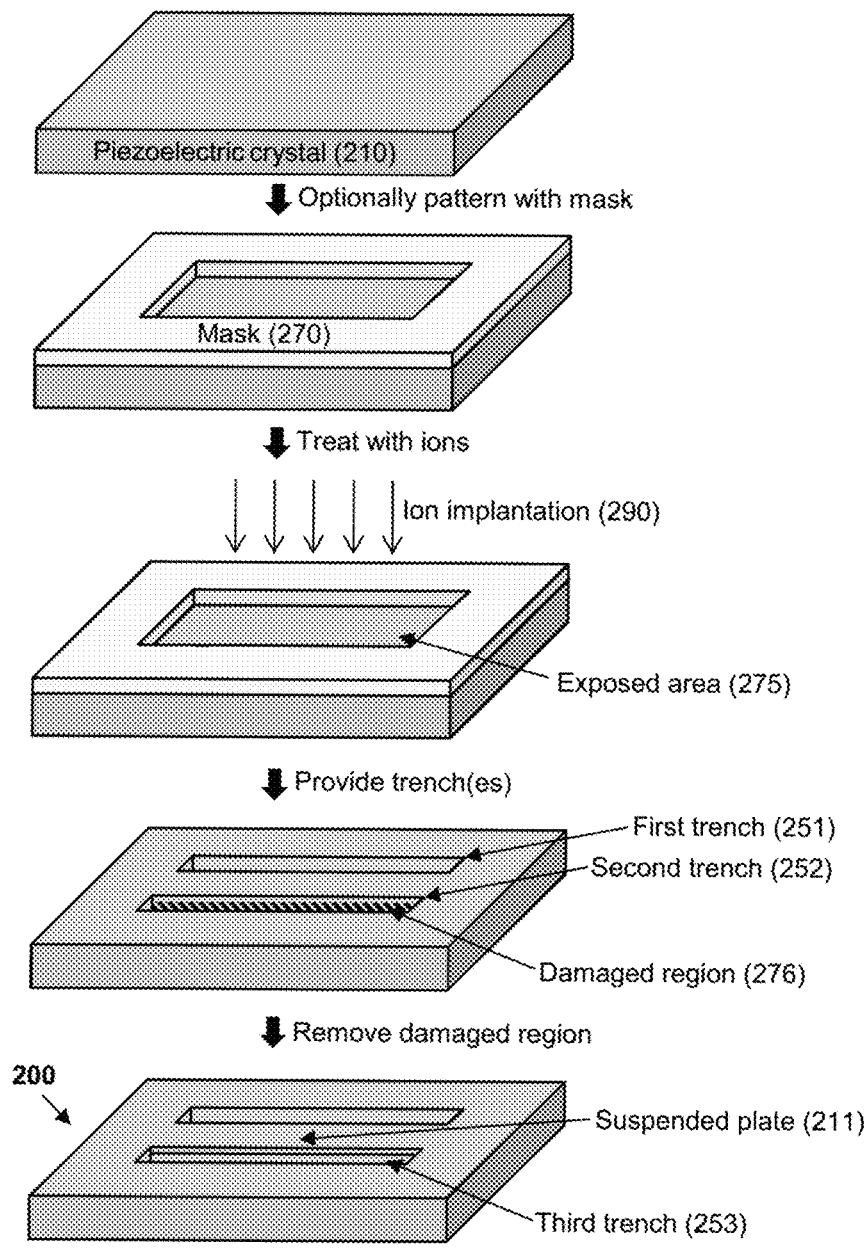
FIG. 3A-3C shows exemplary process flows used to fabricate a microresonator 200, 300, 400. Provided are (A) a schematic of an exemplary process for a microresonator 200; (B) a schematic of an exemplary process for a microresonator having electrodes 300; and (C) top views (left) and cross section views (right) of the microresonator 400 after steps (a)-(f), as described herein.

FIG. 3A describes an exemplary method for forming a thin plate Lamb wave microresonator. The top surface of a substrate 210 (e.g., a single piezoelectric crystal, such as any herein) can include any useful exposed area 275. Optionally, a mask 270 can be patterned on the top surface to define the exposed area 275. The sub-surface portion of the substrate beneath the exposed area will be damaged by ion implantation and ultimately removed. Masked regions will not be exposed to the ions and, therefore, preserved. The mask can be formed from any useful material that will not be penetrated by the ions in the ion implanting step described below. Exemplary mask materials include, e.g., an oxide layer (e.g., SiO$_2$), a hard chrome mask, a nickel mask, a gold mask, etc.

Then, the substrate is exposed to an ion source 290 to provide an ion damaged region 276 below the top surface of the crystal. The ion source can be of any useful type (e.g., helium (e.g., He$^+$), hydrogen, krypton, xenon, magnesium, fluorine, oxygen (e.g., O$^{3+}$), copper, or gold), energy (e.g., of from about 0.5 MeV to about 100 MeV), and fluence (e.g., of from about $10^{12}$ to about $10^{18}$ ions/cm$^2$ or ions/cm$^3$) provided in one or more steps to obtain the appropriate penetration depth, which determines the thickness t of the resonating portion. In some embodiments, the conditions provide a resonating portion having t of from about 0.2 μm to about 2 μm (e.g., about 0.5 μm, 1.0 μm, or 1.5 μm).

Next, one or more trenches 251, 252 are provided to define one or more dimensions of the resonator. For the microresonator 200 in FIG. 3A, the distance between the two trenches determines the width W of the resonating portion, and the length of the trench determines the length L of the resonating portion. The trenches can be provided using any useful technique, such as by patterning the top surface of the substrate with a mask (e.g., an oxide hard mask) defining the trench(es), etching (e.g., dry etching with any useful ion, such as chlorine) the substrate, and then removing the mask. The distance, geometry, arrangement, number, and dimensions of the trenches can be modified to obtain the desired dimensions for the resonating portion of the microresonator(s). In addition, etching conditions can be optimized to ensure that the trenches provide access to the ion damaged region below the surface of the crystal and/or to provide vertical sidewalls for the resonating portion.

Finally, the ion damaged region 276 is removed using an etchant (e.g., a wet etchant), providing a third trench 253 disposed beneath the resonating portion and thereby releasing the resonating portion (here, a suspended plate 211) from the support structure. Any useful etchant can be employed to remove the damaged region. Exemplary etchants include a wet chemical etchant, such as HF and mixtures thereof (e.g., HNO$_3$ and HF mixtures, optionally including ethanol).

Figure 3B:
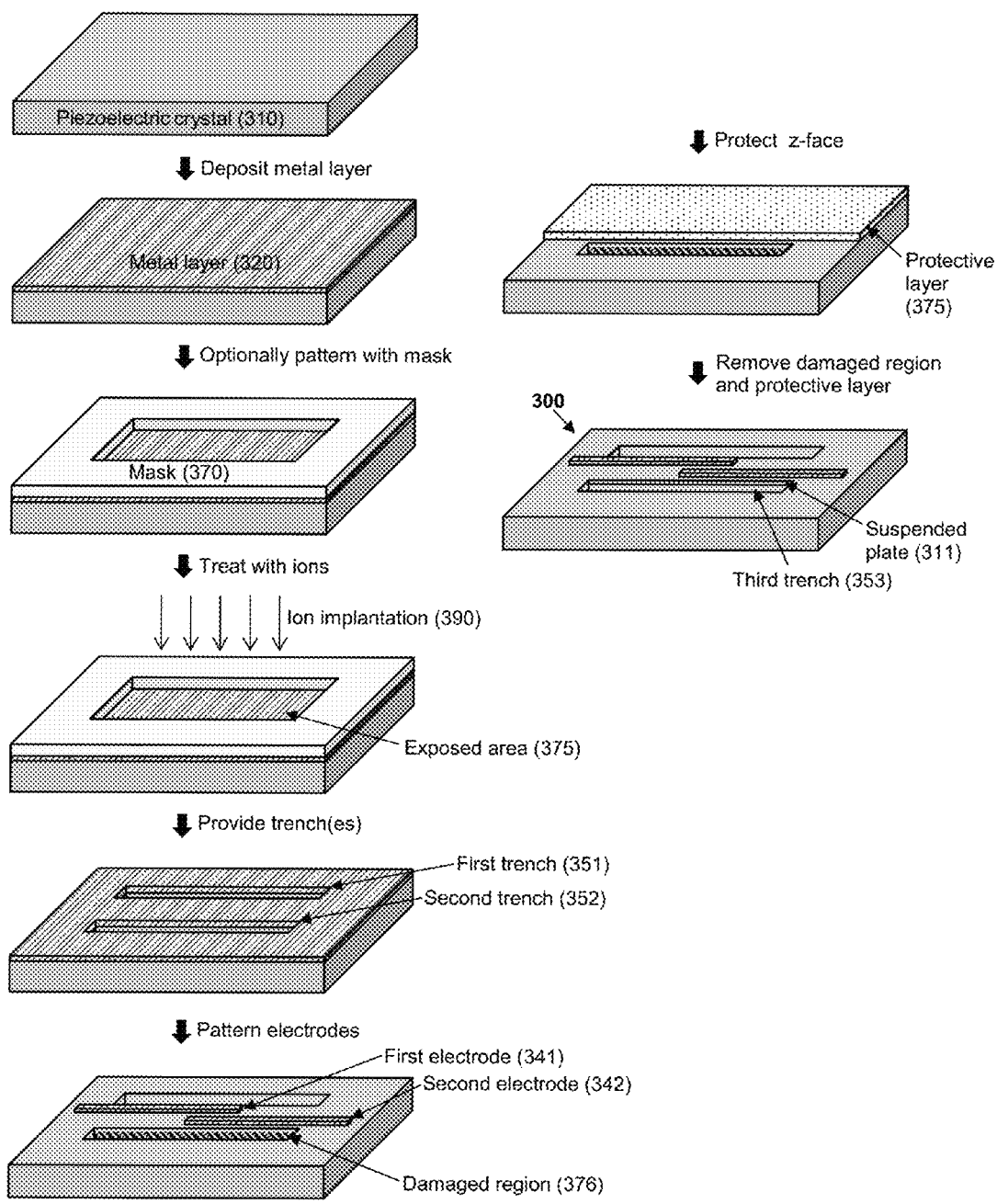
Figure 3C:
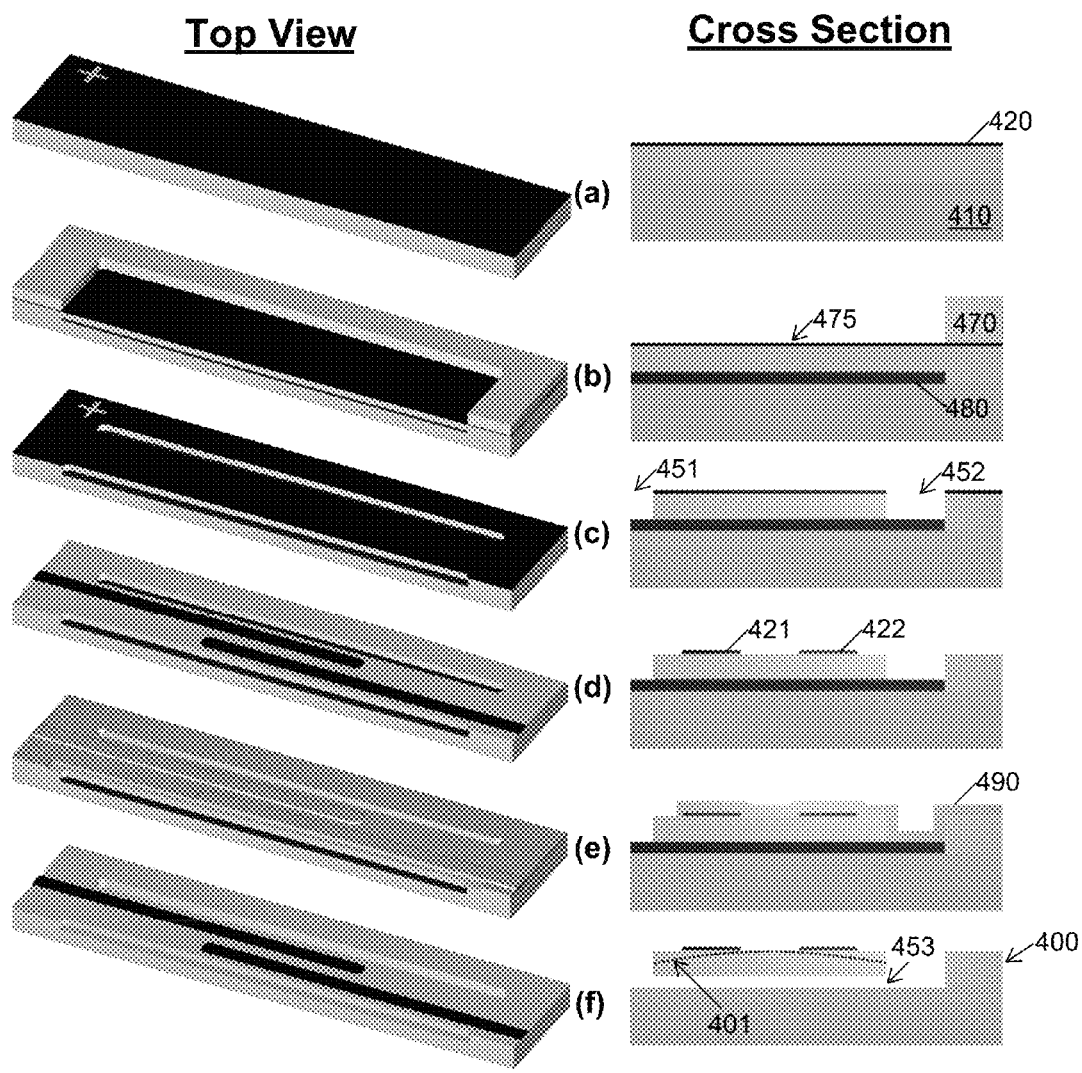

The method can include any number of other useful steps. FIG. 3B provides an exemplary method of fabricating a microresonator having a pair of electrodes, as described below. The details of FIG. 3C are described in Example 1 herein.

First, as seen in FIG. 3B, a metal layer 320 is deposited on a substrate 310 (e.g., a single crystal) by any useful manner (e.g., evaporation, deposition, etc.). Optionally, one or more alignment marks are included in the metal layer 320. This metal layer 320 can include one or more metals, metal alloys, or metal layers useful for making an electrode (e.g., any metal described herein).

Next, the top surface of the substrate 310 having the metal layer 320 is optionally patterned with a mask 370 to define the exposed area 375. The substrate is exposed to an ion source 390 to provide an ion damaged region 376 below the top surface of the crystal. Next, one or more trenches 351, 352 are provided to define one or more dimensions of the resonator.

Then, the metal layer is patterned to provide one or more electrodes. For instance, electrodes 341, 342 can then be patterned on the previously deposited metal layer 320. This step can include any useful lithographic and microfabrication technique, such as any described herein. In addition, the electrode pattern can include one or more useful dimensions, such as aperture a, gap g, space s, electrode width e, or any other dimension described herein. The electrode pattern can include an array of n electrodes or n pairs of electrodes (e.g., as described herein).

Optionally, a protective layer 375 can be deposited to protect a surface of the resonator prior to exposure to an etchant (e.g., a wet etchant). As described herein, particular crystallographic faces can have different etch rates. In particular, the −z face of lithium niobate crystal etches at a higher rate using an HF etchant, as compared to the other faces. Thus, when the −z face is exposed, then a protective layer (e.g., a gold layer) can be deposited to protect this face.

Finally, the ion damaged region 376 is removed using an etchant (e.g., HF or any etchant herein), providing a third trench 353 disposed beneath that resonating portion and thereby releasing the resonating portion from the support structure. If the protective layer is used, then the subsequent step can include a stripping step to strip the protective layer.

Additional steps can include annealing (e.g., about <350° C.), polishing, and/or ovenizing (e.g., use of local joule heaters) to resonators, such any described in Kim B et al., "Ovenized and thermally tunable aluminum nitride microresonators," Proc. 2010 IEEE Ultrason. Symp. (IUS), held on 11-14 Oct. 2010 in San Diego, Calif., pp. 974-8; and U.S. Pat. No. 8,669,823, each of which is incorporated herein by reference in its entirety.

Uses

The microresonators and methods of the present invention can be applied for any beneficial use. Exemplary uses include one or more resonators to form a band select filter (e.g., for use in wireless handsets), a filter bank, an oscillator, a sensor, and arrays thereof. For use in an array (e.g., including a plurality of resonators in parallel), each resonator can be electrically interconnected (e.g., by way of wires, bias lines, etc.) to provide a composite resonator. The array can also include a substrate and a plurality of networks formed on the substrate, where each network is electrically connected in parallel. The array can include at least one input configured to receive an electrical signal and relay this signal to the lattice networks, as well as at least one output to provide a filtered electrical signal. Each network can include at least one microresonator (e.g., any microresonator described herein, where each microresonator can optionally have a different resonant frequency or physical dimension). Additional arrays and uses are described in U.S. Pat. Nos. 7,385,334 and 8,497,747; Aigner R, "MEMS in RF filter applications: thin-film bulk acoustic wave technology," *Sensors Update* 2003 February; 12(1):175-210; Malocha D C, "SAW/BAW acoustoelectronic technology for filters and communication systems," *Proc. 2010 IEEE 11th Annu. Wireless & Microwave Technol. Conf. (WAMICON)*, held on 12-13 Apr. 2010 in Melbourne, Fla., pp. 1-7; and Yantchev V et al., "Thin film Lamb wave resonators in frequency control and sensing applications: a review," *J. Micromech.* *Microeng.* 2013; 23:043001 (14 pp.), each of which is incorporated herein by reference in its entirety.

EXAMPLES

Example 1

A High Electromechanical Coupling Coefficient SH0 Lamb Wave Lithium Niobate Micromechanical Resonator and a Method for Fabrication Described herein is a high coupling coefficient $k_{eff}^2$ micromechanical resonator based on the propagation of SH0 Lamb waves in thin, suspended plates of single crystal X-cut lithium niobate (LiNbO$_3$). The thin plates were fabricated without the cumbersome wafer bonding, layer fracturing and chemical mechanical polishing in previously reported LiNbO$_3$ microfabrication approaches. The highest coupling coefficient was found for resonators with acoustic propagation rotated 80° from the z-axis (170° from the y-axis), where a fundamental mode SH0 Lamb wave resonator propagating in a 1.2 µm thick plate with a plate width of 20 µm and a corresponding resonant frequency of 101 MHz achieved a coupling coefficient $k_{eff}^2$=12.4%, a quality factor Q=1300, and a resonator figure of merit FOM=185. The $k_{eff}^2$ and FOM are among the highest reported for micromechanical resonators. Additional details follow.

Microresonators are miniature acoustic resonators fabricated using integrated circuit (IC) microfabrication techniques. Recently, microresonators have become of great interest because the CAD-definable resonant frequency allows many filters spanning from several hundred MHz to several GHz to be realized on a single chip (Piazza G et al., "Piezoelectric aluminum nitride thin films for microelectromechanical systems," *MRS Bull.* 2012 November; 37(11): 1051-61; and Nguyen CTC, "MEMS technology for timing and frequency control," *IEEE Trans. Ultrason. Ferroelect. Freq. Contr.* 2007 February; 54(2):251-70). This is especially important for next generation cellular handsets, where the growing number of frequency bands each typically require a discrete filter die. Microresonator technology provides a potential path for integrating many band select filters on a single die, thus reducing the size, cost and complexity of next generation wireless handsets.

Currently, band select filters in cellular handset are realized using a combination of many dies containing bulk (BAW) or surface (SAW) acoustic wave resonators (see, e.g., Aigner R, "SAW and BAW technologies for RF filter applications: A review of the relative strengths and weaknesses," *Proc. 2008 IEEE Ultrason. Symp.* held 2-5 Nov. 2008, in Beijing, China, pp. 582-9; Lakin K M, "A review of thin-film resonator technology," *IEEE Microwave Mag.* 2003 December; 4(4):61-7; Ruby R et al., "PCS 1900 MHz duplexer using thin film bulk acoustic resonators (FBARs)," *Electron. Lett.* 1999 May; 35(10):794-5; Campbell C K, "Applications of surface acoustic and shallow bulk acoustic wave devices," *Proc. IEEE* 1989 October; 77(10):1453-84; and Kadota M, "Development of substrate structures and processes for practical applications of various surface acoustic wave devices," *Jpn. J. Appl. Phys.* 2005 June; 44(6B): 4285-91).

Aluminum nitride (AlN) based BAW resonators and SAW resonators formed in lithium niobate (LiNbO$_3$) or lithium tantalate (LiTaO$_3$) have the high coupling coefficients $k_{eff}^2$ required to achieve the required band select filter bandwidths of ~3% of the filter center frequency and the quality factors required for steep filter roll off all while maintaining low filter insertion loss. AlN BAW resonators operate based on the thickness of a deposited thin film and require a separate film thickness for each filter frequency. This makes integration of multiple frequency filters on a single die both challenging and costly. While in theory SAW resonators can support a wide range of frequencies on a single chip, in practice, the thickness of the metal interdigitated electrodes used to transduce SAW resonator is varied with frequency (Kadota M, *Jpn. J. Appl. Phys.* 2005 June; 44(6B):4285-91), limiting the range of filter bands that can be covered on a single chip. Furthermore, the low SAW phase velocity limits the application of SAW technology in emerging high frequency bands above 2.5 GHz (Aigner R, *Proc. 2008 IEEE Ultrason. Symp.* held 2-5 Nov. 2008, in Beijing, China, pp. 582-9).

Recently, both piezoelectric and electrostatically transduced microresonators have been the subject of research (see, e.g., Piazza G et al., *MRS Bull.* 2012 November; 37(11):1051-6; Kim B et al, "AlN microresonator-based filters with multiple bandwidths at low intermediate frequencies," *J. Microelectromech. Sys.* 2013 August; 22(4):949-61; Lin C M et al., "Temperature-compensated aluminum nitride Lamb wave resonators," *IEEE Trans. Ultrason. Ferroelect. Freq. Contr.* 2010 March; 57(3):524-32; Piazza G et al. "Single-chip multiple-frequency AlN MEMS filters based on contour-mode piezoelectric resonators," *J. Microelectromech. Sys.* 2007 April; 16(2):319-28; Abdolvand R et al., "Thin-film piezoelectric-on-silicon resonators for high-frequency reference oscillator applications," *IEEE Trans. Ultrason. Ferroelect. Freq. Contr.* 2008 December; 55(12): 2596-606; Pulskamp J S et al., "Piezoelectric PZT MEMS technologies for small-scale robotics and RF applications," *MRS Bull.* 2012 November; 37(11):1062-70; Nguyen CTC, *IEEE Trans. Ultrason. Ferroelect. Freq. Contr.* 2007 February; 54(2):251-70; Casinovi G et al., "Lamb waves and resonant modes in rectangular-bar silicon resonators," *J. Microelectromech. Sys.* 2010 August; 19(4):827-39; and Weinstein D et al., "Internal dielectric transduction in bulk-mode resonators," *J. Microelectromech. Sys.* 2009 December; 18(6):1401-8). By establishing the resonance on a laterally propagating Lamb wave in a suspended plate with a thickness less than an acoustic wavelength, a wide range of filter frequencies can be achieved on a single wafer by altering the CAD-layout of the devices. The $k_{eff}^2$ of electrostatically driven resonators at frequencies relevant to cellular communications are orders of magnitude lower than that required for band select filters (see, e.g., Gong S et al., "Design and analysis of lithium-niobate-based high electromechanical coupling RF-MEMS resonators for wideband filtering," *IEEE Trans. Microwave Theory Tech.* 2013 January; 61(1):403-14).

Piezoelectric Lamb wave resonators formed in deposited thin films of aluminum nitride (AlN), zinc oxide (ZnO), and lead zirconate titanate (PZT), while having much higher coupling coefficients than electrostatically transduced microresonators, still do not have a high enough coupling coefficient for many of the band select filters in wireless handsets.

In 2001 Kuznetsova et al. ("Investigation of acoustic waves in thin plates of lithium niobate and lithium tantalate," *IEEE Trans. Ultrason. Ferroelect. Freq. Contr.* 2001 January; 48(1):322-8) reported the theoretically large piezoelectric coupling that could be achieved for Lamb resonators in thin films of single crystal $LiNbO_3$. The largest coupling reported by Kuznetsova et al. was for the SH0 Lamb mode in X-cut $LiNbO_3$ with a $k_{eff}^2$ of 27.4%. The challenge is in realizing thin, suspended membranes of single crystal piezoelectric materials with much higher coupling coefficients than the deposited polycrystalline piezoelectric thin films such as AlN, ZnO, and PZT.

Recently, symmetric (S0) Lamb wave microresonators have been reported in suspended thin films of single crystal X-cut $LiNbO_3$ and 136° rotated Y-cut $LiNbO_3$ (see, e.g., Gong S et al., *IEEE Trans. Microwave Theory Tech.* 2013 January; 61(1):403-14; and Wang R et al., "High $k_t^2 \times Q$, multi-frequency lithium niobate resonators," *Proc. 2013 IEEE 26th Int'l Conf. Micro Electro Mechanical Systems (MEWS)*, held 20-24 Jan. 2013 in Taipei, Taiwan, pp. 165-8). Both of the fabrication processes reported in these publications required bonding of a $LiNbO_3$ device wafer to a handle wafer using a glue layer. Thin films of $LiNbO_3$ directly over the glue/release layer were then realized either by polishing back the $LiNbO_3$ device wafer to the desired thickness of ~1 µm or by fracturing the $LiNbO_3$ device wafer just below the wafer surface that was previously ion implanted to induce a damaged fracture plane (Wang R et al., *Proc. 2013 IEEE 26th Int'l Conf. Micro Electro Mechanical Systems (MEWS)*, held 20-24 Jan. 2013 in Taipei, Taiwan, pp. 165-8; Gong S et al., *IEEE Trans. Microwave Theory Tech.* 2013 January; 61(1):403-14; Moulet J S et al., "High piezoelectric properties in $LiNbO_3$ transferred layer by the Smart Cut™ technology for ultra wide band BAW filter applications," *Proc. 2008 IEEE Int'l Electron. Devices Meeting*, held 15-17 Dec. 2008 in San Francisco, Calif., pp. 1-4; and Aspar B et al., "The generic nature of the Smart-Cut® process for thin film transfer," *J. Electron. Mater.* 2001 July; 30(7):834-40).

In this Example, we provide a Lamb wave $LiNbO_3$ microresonator fabricated in a process that does not require costly wafer bonding, polishing or fracturing processes (see, e.g., Yu Y C et al., "Crystal ion-slicing lithium niobate film performed by 250 keV⁴He ion implantation," *Nucl. Instr. Meth. Phys. Res. B,* 2007 March; 256(1):558-60; and Si G et al., "Suspended slab and photonic crystal waveguides in lithium niobate," *J. Vac. Sci. Technol. B* 2010 March; 28(2):316-20). The thin plates were fabricated using ion implantation of He to create an ion damaged layer of $LiNbO_3$ at a desired depth below the wafer surface. This damaged layer was selectively wet etched in hydrofluoric (HF) acid based chemistry to form thin, suspended plates of $LiNbO_3$.

Using this fabrication process, we observed high coupling coefficient SH0 Lamb wave resonators in X-cut $LiNbO_3$. The highest coupling coefficient was found for resonators with acoustic propagation rotated 80° from the z-axis (see FIG. 2), which is in agreement with the theory reported in Kuznetsova I E et al., *IEEE Trans. Ultrason. Ferroelect. Freq. Contr.* 2001 January; 48(1):322-8.

A fundamental mode SH0 Lamb wave resonator propagating in an ~1.2 µm thick plate with a width of 20 µm and a corresponding resonant frequency of 101 MHz achieved a $k_{eff}^2$ of 12.4%, a quality factor Q of 1300, and a resonator figure of merit FOM of 185. The $k_{eff}^2$ and FOM are among the highest reported for micromechanical resonators.

Single Crystal Lithium Niobate Microfabrication Process:

The $LiNbO_3$ microresonators were fabricated using the process flow shown in FIG. 3C. As shown in step (a), the process began with the evaporation of 100 nm of Cr 420 and the patterning of alignment marks in the Cr on X-cut $LiNbO_3$ 410.

Next, in step (b), an oxide layer 470 was deposited and patterned to define an area 475 where an ion implant will penetrate the $LiNbO_3$, thereby creating an ion damaged $LiNbO_3$ release layer 480 at the end of the ion implant range.

Patterning where the ion implant penetrates the LiNbO$_3$ allowed the lateral extents of the device release to be precisely controlled. The sample was then implanted with a He dose of 1×10$^{16}$ atoms/cm$^3$ at an energy of 0.8 MeV to create an ion damaged release layer of LiNbO$_3$ 480 approximately 1.8 μm below the wafer surface. The implants were performed in a 3 MV NEC Pelletron using a current of <7 μA. To maintain a low sample temperature, the LiNbO$_3$ was cooled by liquid nitrogen using a Cu braid during implantation. While the ion implant passes through the Cr electrodes in the device region, measurements confirmed that Cr resistivity was not altered by the ion implant.

Then, in step (c), trenches 451, 452 that define the final resonator dimensions and resonant frequency were etched in the LiNbO$_3$, thereby exposing the ion damaged LiNbO$_3$ release layer. The LiNbO$_3$ was dry etched at 15° C. using an Ar/BCl$_3$/Cl$_2$ gas mixture at 10 mT on a PlasmaTherm Versaline 4 in. ICP system using a newly optimized process. This process was capable of producing sidewalls with >80° sidewall angle and etch depths >2 μm.

Next, in step (d), the Cr electrodes 421, 422 were patterned. Optionally, as shown in step (e), a 1 μm Au layer was deposited and patterned to protect the −z face of the LiNbO$_3$ during the release. We measured the etch rates in the wet hydrofluoric acid release chemistry for the ion damaged LiNbO$_3$ and for the different crystal faces of LiNbO$_3$ (Table 1).

TABLE 1

Etch rates of LiNbO$_3$ using HF

| LiNbO$_3$ | Etch rate (nm/hr) |
|---|---|
| Ion damaged release layer | 9000 |
| +x, −x crystal face | 14 |
| +y, −y crystal face | 204 |
| +z crystal face | <14 |
| −z crystal face | 2200 |

Additional studies of etching LiNbO$_3$ in aqueous HF can be in found in, e.g., Randles A B et al., "Etch rate dependence on crystal orientation of lithium niobate," *IEEE Trans. Ultrason. Ferroelect. Freq. Contr.* 2010 November; 57(11): 2372-80; and Reinisch J et al., "Etching of ion irradiated LiNbO$_3$ in aqueous hydrofluoric solutions," *J. Electrochem. Soc.* 2008 February; 155(4):D298-D301. While the etch rates of the +z, y, and x crystal faces were much lower than the ion damaged LiNbO$_3$, the etch rate of the −z face was only four times lower than that of the ion damaged LiNbO$_3$.

Since the highest $k_{eff}^2$ microresonators rotated 80° from the z-axis have a slight −z face component for one of the resonator sidewalls, this Au layer can be used to protect the −z face and more accurately control the final dimensions of the microresonator. In step (f), the device 400 was released using a wet hydrofluoric acid chemistry to remove the ion damaged layer of LiNbO$_3$, thereby forming a trench 453. The devices were annealed at >300° C. to heal the implant damage in the device layer and flatten the devices. Finally, if utilized, the Au layer used to protect the −z face of the microresonator sidewall can be stripped in a mixture of potassium iodide and iodine, KI—I$_2$. Also shown is the stress field of the acoustic standing wave 401.

Figure 4A:
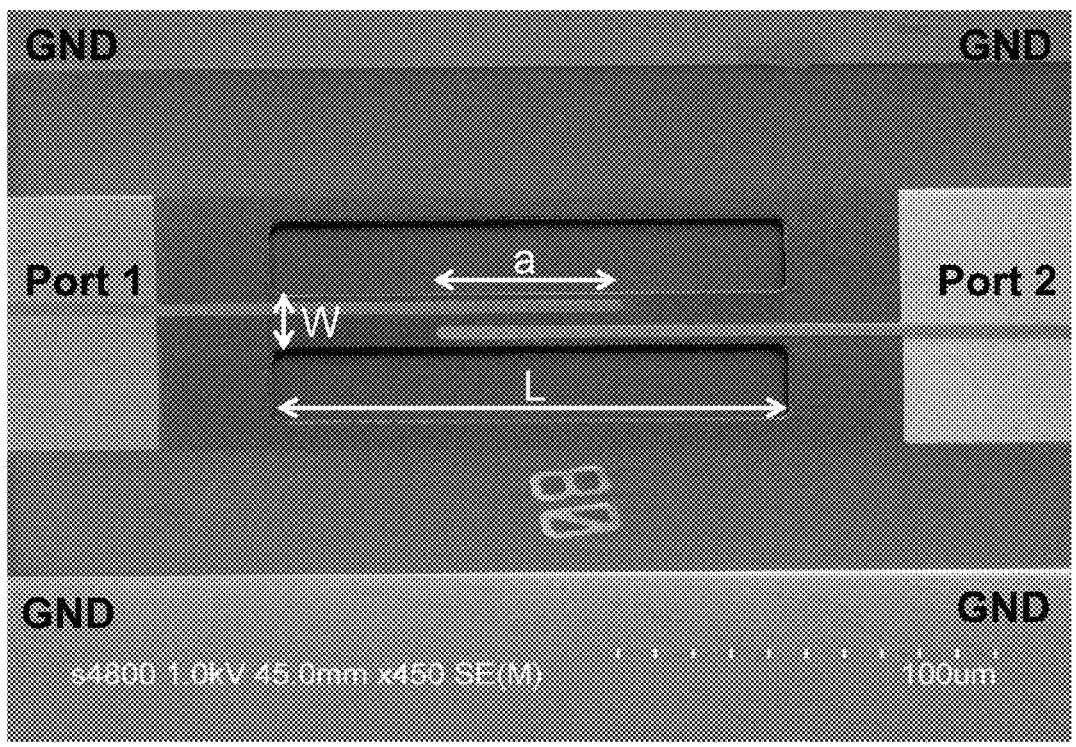
FIG. 4A-4B shows scanning electron microscope images of a LiNbO₃ microresonator rotated 80° to the z-axis (or 170° to the y-axis). The designed microresonator dimensions are for a width W=20 μm, length L=140 μm, and an aperture (or electrode overlap) a=50 μm. Each electrode is 5 μm wide, and the gap g between electrodes is also 5 μm. Provided is (A) a top view and (B) a close-up view of a released LiNbO₃ microresonator.

A scanning electron micrograph (SEM) image of a LiNbO$_3$ microresonator with acoustic propagation rotated 80° from the z-axis is shown in FIG. 4A. The designed microresonator dimensions are for a width W=20 μm, length L=140 μm, and an aperture (electrode overlap) a=50 μm. The width of each Cr electrode e=5 μm, and the gap between electrodes g=5 μm. The acoustic wave propagated in the width extensional direction, i.e., in the direction of W.

Figure 4B:
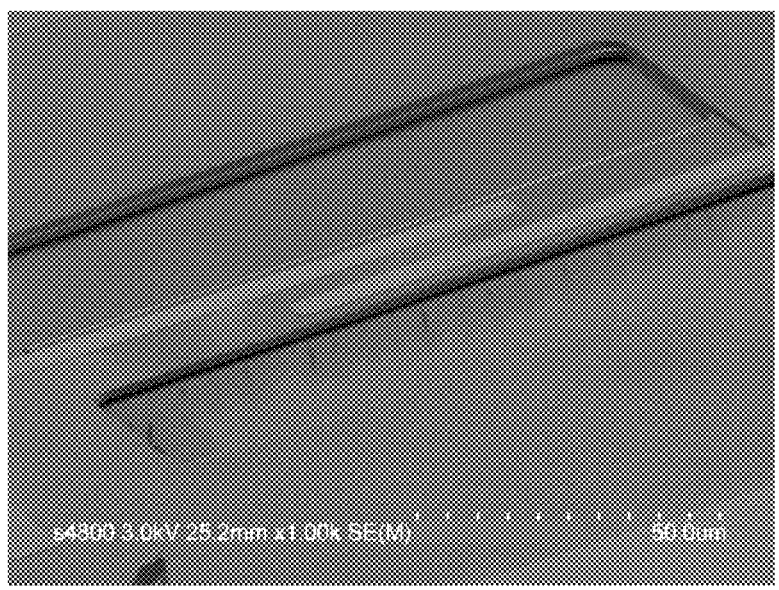
Figure 5A:
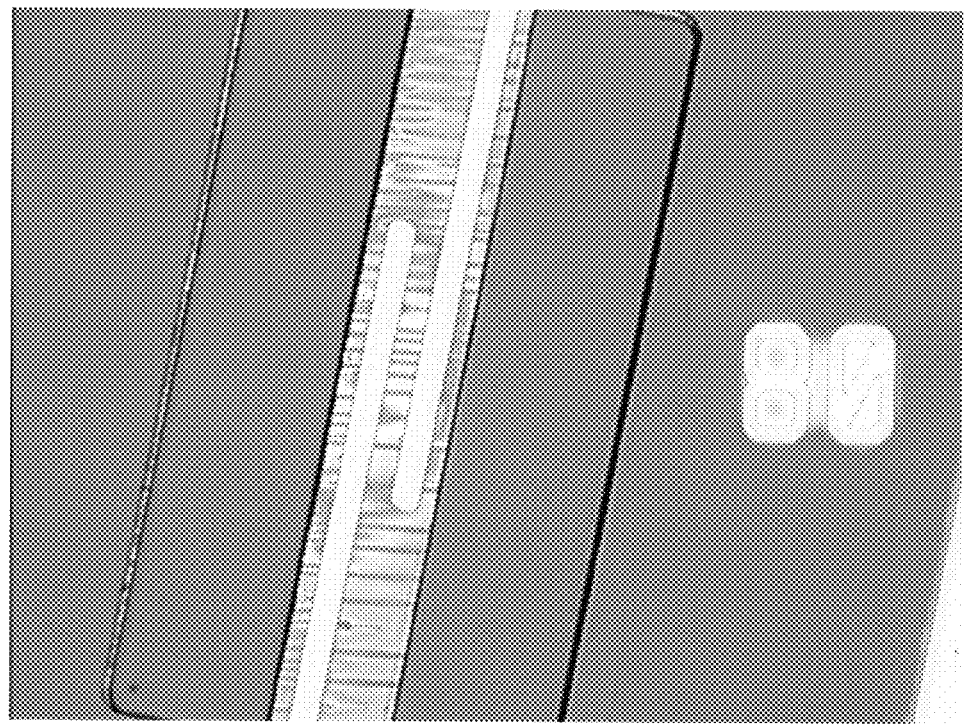
FIG. 5A-5B shows optical images of a LiNbO₃ microresonator rotated at different angles. Provided are LiNbO₃ microresonators (A) rotated 80° to the z-axis (170° to they-axis) and (B) rotated 70° to the z-axis (160° to the y-axis) just prior to release.

A zoomed in image of a suspended LiNbO$_3$ microresonator is shown in FIG. 4B, and an optical image of a LiNbO$_3$ microresonator with acoustic propagation rotated 80° from the z-axis is shown in FIG. 5A. Addition SEM images of the underside of the LiNbO$_3$ resonators revealed a smooth surface and a final plate thickness of approximately 1.2 μm.

Figure 5B:
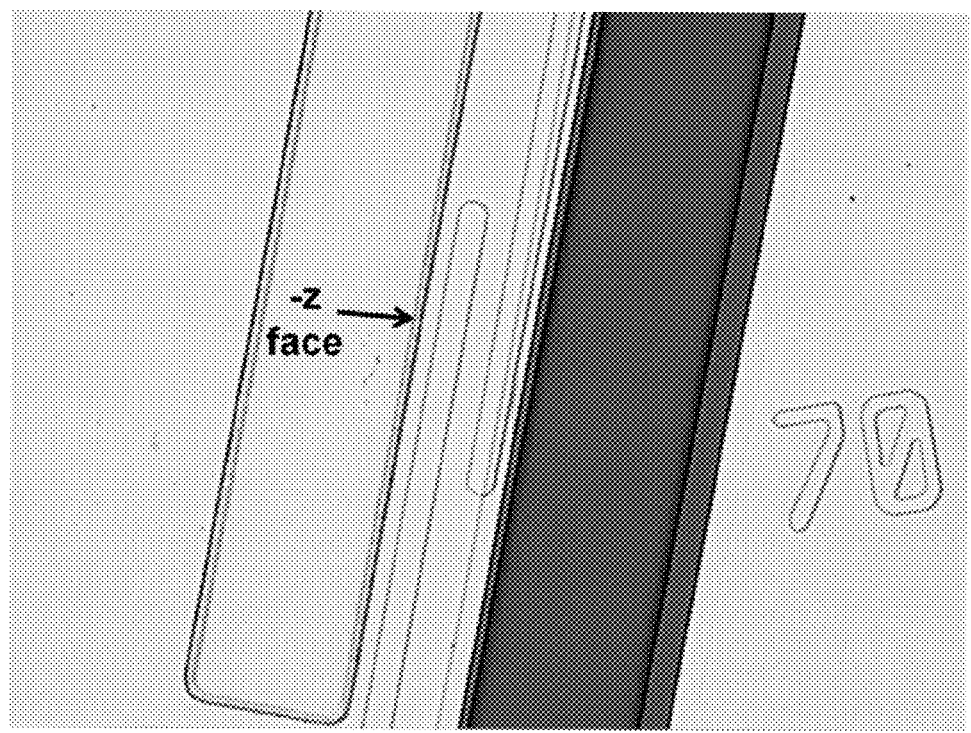

FIG. 5B shows an optical image of a LiNbO$_3$ microresonator with acoustic propagation rotated 70° from the z-axis just prior to release. The device in FIG. 5B has the Au layer from FIG. 3C, step (e), to protect the −z face of the microresonator during the HF release patterned on the wafer surface. All of the devices shown have identically designed dimensions given in FIG. 4A.

Figure 6:
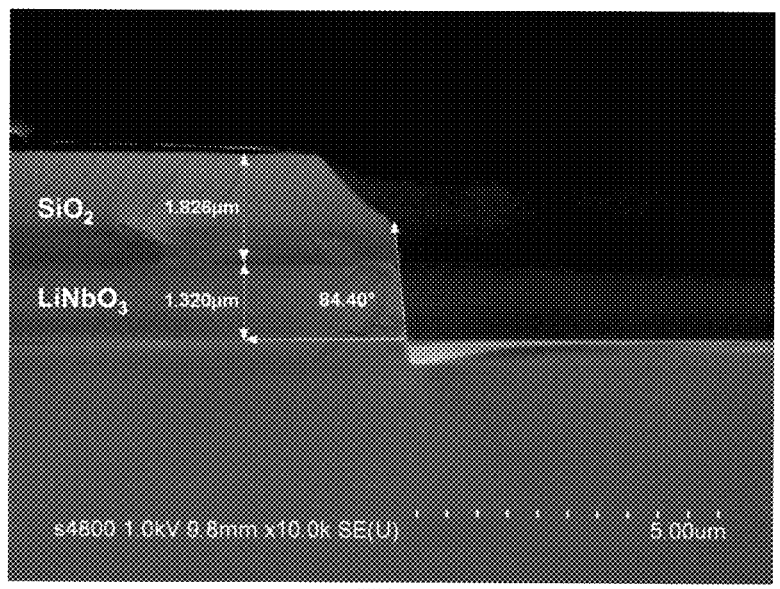
FIG. 6 is a cross section image after chlorine dry etching 1.32 μm of X-cut LiNbO₃ rotated 80° from the z-axis (170° from they-axis) using an oxide hard mask. The sidewall angle is in excess of 84°.

In a microresonator, the acoustic energy is reflected off of an etched sidewall. In order for the microresonator width W to be nearly identical through the resonator thickness, the etched sidewall angle must be as steep as possible. A significant sidewall angle can both lower the resonator quality factor and introduce spurious responses. Shown in FIG. 6 is a cross section image after chlorine dry etching of 1.32 μm of X-Cut LiNbO$_3$ rotated 80° from the z-axis using an oxide hard mask. The sidewall angle is in excess of 84° and is vertical enough to ensure high device quality factors.

Lithium Niobate Microresonator Modeling: The SH0 mode microresonators with acoustic propagation rotated 80° from the z-axis formed in X-cut LiNbO$_3$ were studied using finite element modeling (FEM) in ANSYS. For the simulations, the material constants shown in Table 2 were used (Kovacs G et al., "Improved material constants for LiNbO$_3$ and LiTaO$_3$," *Proc. 1990 IEEE Ultrason. Symp.* held 4-7 Dec. 1990 in Honolulu, Hi., vol. 1, pp. 435-8) and are slightly different from those reported in Gong S et al., *IEEE Trans. Microwave Theory Tech.* 2013 January; 61(1):403-14.

TABLE 2

Material properties of X-cut LiNbO$_3$ used for the finite element modeling

| | Symbol | Value |
|---|---|---|
| Elastic constants (10$^9$ N/m$^2$) | $c_{11}$ | 199.39 |
| | $c_{12}$ | 54.72 |
| | $c_{13}$ | 65.13 |
| | $c_{14}$ | 7.88 |
| | $c_{33}$ | 227.9 |
| | $c_{44}$ | 59.65 |
| | $c_{66}$ | 72.34 |
| Piezoelectric constants (C/m$^2$) | $e_{15}$ | 3.69 |
| | $e_{22}$ | 2.42 |
| | $e_{31}$ | 0.3 |
| | $e_{33}$ | 1.77 |
| Dielectric constants (F/m) | $\epsilon_{11}$ | 45.6 |
| | $\epsilon_{33}$ | 26.3 |
| Density (kg/m$^3$) | $\rho$ | 4628 |

A Young's modulus, density, and Poisson ratio of 279 GPa, 7190 kg/m$^3$, and 0.21 were used to model the Cr electrodes. The devices modeled all had the dimensions given in FIG. 4A, with a plate width W=20 μm, total length L=140 μm, and an aperture a=50 μm. All devices modeled had a thickness t=1.2 μm, giving a thickness to wavelength ratio (h/λ) of 0.03, very close to the optimal value for maximizing $k_{eff}^2$ of 0.05 found in Kuznetsova I E et al., *IEEE Trans. Ultrason. Ferroelect. Freq. Contr.* 2001 January; 48(1):322-8.

Figure 7:
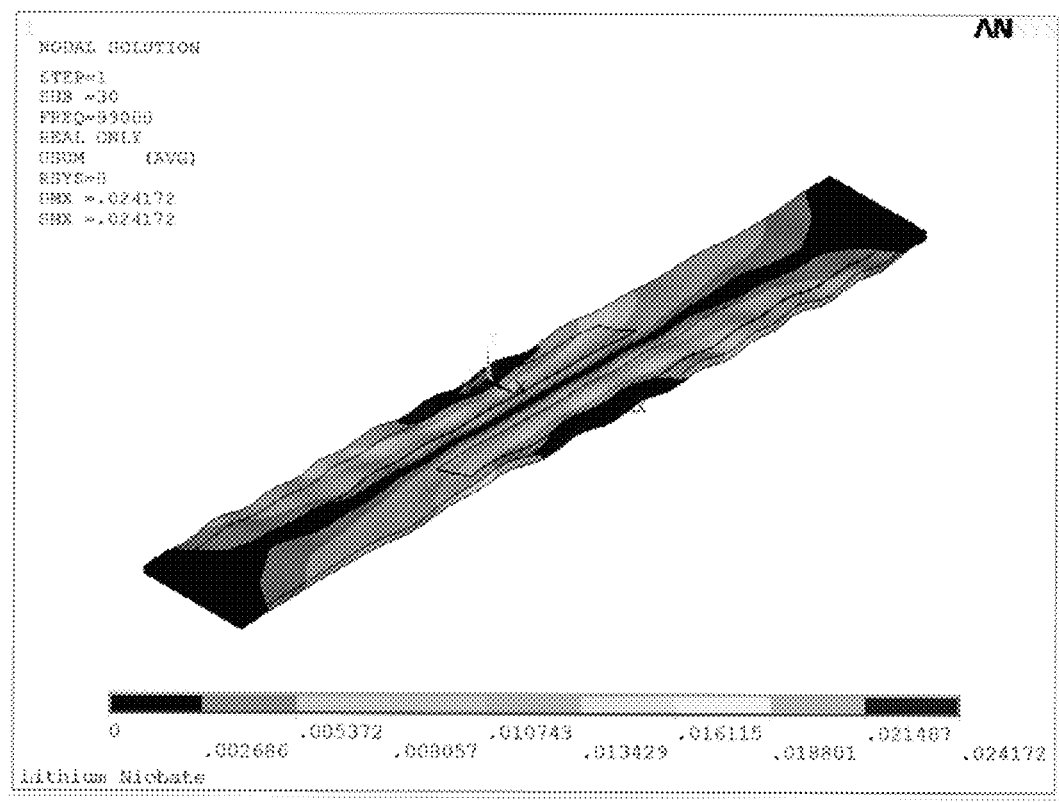
FIG. 7 is a finite element modeling (FEM) showing the displacement profile of the mode shape, on resonance, for the SH0 Lamb wave in the device shown in FIG. 4A.

The devices were designed to vibrate in the fundamental SH0 mode with the frequency $f_s$ defined by the plate width using Eq. (1):

$$f_s = \frac{C_{SH}}{\lambda} = \frac{C_{SH}}{2W}, \quad (1)$$

where $C_{SH}$ is the velocity of the SH0 wave in the thin LiNbO$_3$ plate and $\lambda$ is the acoustic wavelength. The SH0 mode shape for the device in FIG. 4A with 5 μm wide electrodes separated by a gap of 5 μm is shown in FIG. 7. The resonant frequency of 96.12 MHz corresponds to a sound velocity $C_{SH}$=3845 m/s using Eq. (1).

The motional impedance of the resonator $R_X$ was determined as follows:

$$R_X = \frac{1}{2\pi f_s K^2 Q C_S}, \quad (2)$$

where $C_S$ is the capacitance between the electrode fingers in FIG. 3A and $K^2$ is the piezoelectric coupling. $C_S$ is directly proportional to the electrode overlap, or aperture a, and is a complex function of the electrode width and spacing (Gupta K C et al., "Microstrip Lines and Slotlines: Second Edition," Artech House Publishers (Norwood, Mass.), 1996, p. 133). Since it will be subsequently shown that the electrode spacing also effects the resonator coupling coefficient, a general approach is to design the electrode placement for maximum, or lower if desired, coupling coefficient and then to adjust the resonator impedance to the desired value by varying the electrode overlap.

To study the effect of the electrode placement on the resonator coupling coefficient, harmonic analysis was utilized. A degraded resonator quality factor of 100 was used in the harmonic simulations to provide a fast simulation time. A 5 μm thick layer of vacuum ($\in$=1) was included above the resonator, which is important for accurately predicting the coupling coefficient.

Figure 8:
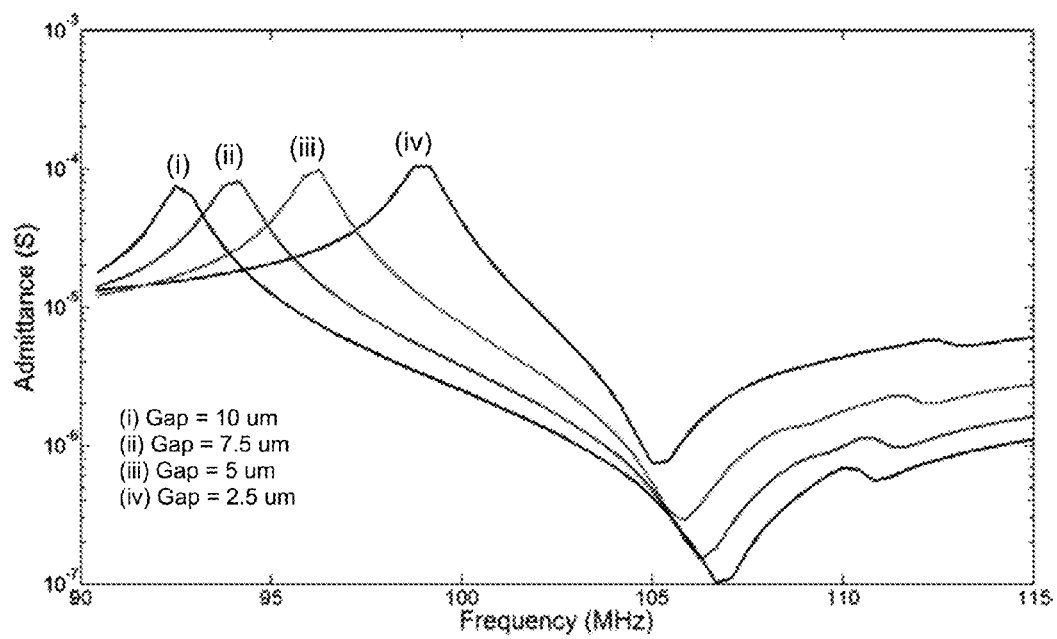
FIG. 8 shows simulated admittance versus frequency using finite element modeling of the SH0 mode LiNbO₃ microresonator with a quality factor of 100, 5 μm wide electrodes, and a varying electrode gap. Provided are simulations with a 5 μm layer of vacuum surrounding the resonator. The coupling coefficient is seen to increase for larger electrode gaps indicating optimum placement of the electrodes at the anti-nodes.

First, the gap between the 100 nm thick Cr electrodes was varied from 2.5 μm to 10 μm while holding the electrode width constant at 5 μm, with the simulated resonator admittances shown in FIG. 8. As the gap between the electrodes increase, the device resonant frequency decreases. This is because the electrodes are moving closer to the resonator anti-nodes, where mass loading causes the resonant frequency to be reduced.

The resonator coupling coefficient was then extracted from the simulations using the IEEE standard (The Institute of Electrical and Electronics Engineers, Inc., "An American National Standard: IEEE Standard on Piezoelectricity," IEEE (New York, N.Y.), 1988, p. 51):

$$k_{eff}^2 = \frac{f_p^2 - f_s^2}{f_p^2}, \quad (3)$$

where $f_s$ is the frequency of maximum admittance and $f_p$ is the frequency of minimum admittance from FIG. 8. Here, we use $k_{eff}^2$ as the effective resonator coupling coefficient, which is commonly used in filter design to predict the maximum bandwidth filter that can be realized with a given resonator. The effective resonator coupling coefficient is related to the piezoelectric coupling $K^2$ reported in Kuznetsova I E et al., *IEEE Trans. Ultrason. Ferroelect. Freq. Contr.* 2001 January; 48(1):322-8, by following Eq. (4):

$$k_{eff}^2 = \frac{K^2}{1+K^2} \quad (4)$$

$$k_{eff}^2 = \frac{K}{1+K}.$$

As the electrode gap was increased from 2.5 μm to 15 μm, the coupling coefficient increased from 11.4% to 24.9%. This suggests that locating the electrodes near the resonator edges or anti-nodes results in the maximum coupling coefficient. A similar result was found for overtone resonators in Wang R et al., *Proc. 2013 IEEE 26th Int'l Conf. Micro Electro Mechanical Systems (MEMS)*, held 20-24 Jan. 2013 in Taipei, Taiwan, pp. 165-8. Despite the lower coupling coefficient, the admittance of the resonators at series resonance was seen to increase for narrower electrode spacings because of the higher shunt capacitance and resulting larger transduction force of narrower electrode gaps. This suggests that the resonator coupling coefficient and motional impedance per unit area, which will set the final filter size for a given design, can be traded off to find an optimal implementation.

Figure 9:
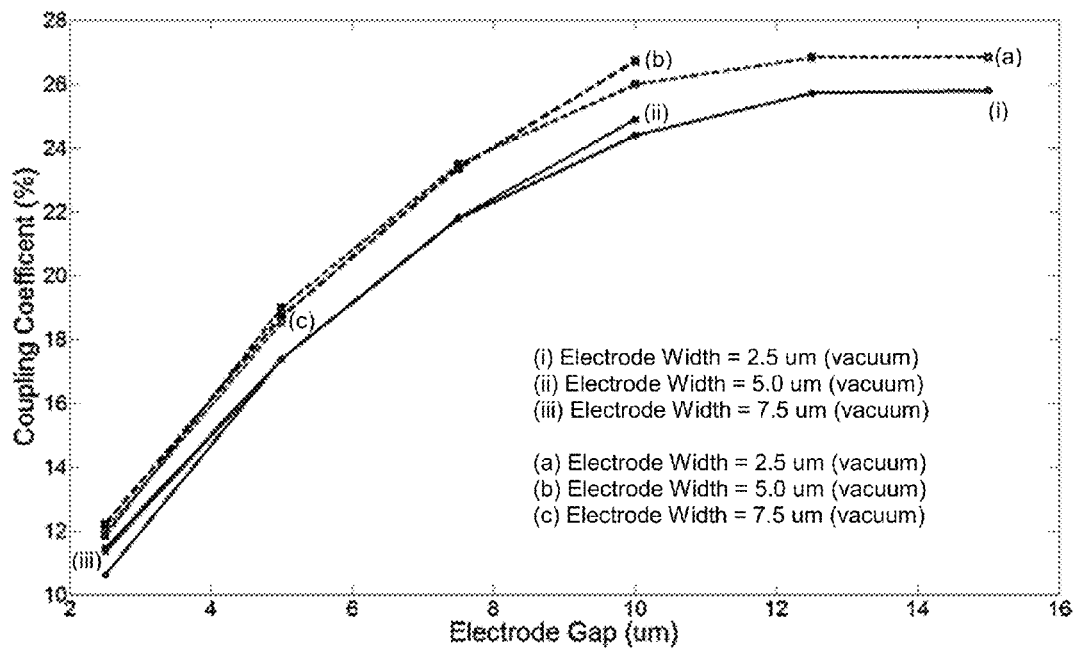
FIG. 9 shows simulated coupling coefficient versus electrode gap using finite element modeling of the SH0 mode LiNbO₃ microresonator with a quality factor of 100 and varying electrode widths. The coupling coefficient is seen to increase for larger electrode gaps indicating optimum placement of the electrodes at the anti-nodes and to be weakly dependent on the electrode width. The solid lines are for finite element simulations with a 5 μm thick layer of vacuum above and below the resonator, while the dashed lines are for simulations omitting the dielectric properties above and below the device. Omitting vacuum around the resonator overestimates the coupling coefficient by as much as 1.8%.

A similar analysis of $k_{eff}^2$ versus electrode gap was performed for electrode widths of 2.5 μm and 7.5 μm with the results shown in FIG. 9. The solid lines in FIG. 9 represent the results of harmonic analysis simulations performed with the 5 μm layer of vacuum surrounding the microresonator device, while the dashed lines are the results when no vacuum layer is included in the finite element model. Omitting the vacuum layer over-predicted the coupling coefficient. The maximum $k_{eff}^2$ with the vacuum layer was found to be 25.8%; this is in good agreement with the theoretical analysis in Kuznetsova L E et al., *IEEE Trans. Ultrason. Ferroelect. Freq. Contr.* 2001 January; 48(1):322-8.

The optimum design to yield the largest coupling coefficient occurred for an electrode width of 2.5 μm and a gap of 15 μm. This design, however, resulted in electrodes that run directly to the edge of the resonator. For ease of fabrication, we chose an electrode width and gap of 5 μm for our initial experimental studies of SH0 Lamb wave resonators in LiNbO$_3$ plates.

Measured Results and Discussion: An SH0 mode LiNbO$_3$ microresonator rotated 80° to the z-axis, such as that shown in FIG. 4A and FIG. 5A, was measured in vacuum with the response shown in black in FIG. 10 (narrow span) and FIG. 11 (wide span). In order to determine the resonator coupling coefficient $k_{eff}^2$ and quality factor Q, the measured admittance was fit to the modified Butterworth-Van Dyke resonator equivalent circuit model shown in FIG. 12 using the following Eqs. (5)-(7):

$$C_X = \frac{1}{2\pi f_s Q R_X}, \quad (5)$$

$$C_S = \frac{\pi^2 C_X}{8k_t^2}, \text{ and} \quad (6)$$

$$L_X = \frac{QR_X}{2\pi f_s}, \quad (7)$$

where $R_X$ is the measured resonator motional impedance. We note here the difference between $k_t^2$ in Eq. (6) and $k_{\mathit{eff}}^2$ in Eq. (3). The parasitic capacitance to ground of the bond pads was found to be negligible and was not included in the resonator equivalent circuit model.

Excellent agreement between the measured admittance and the electrical equivalent circuit model were found for a motional impedance $R_X$=1076Ω, a resonator frequency $f_s$=100.965 MHz, a quality factor Q=1300, and a coupling coefficient $k_t^2$=17.5%. These parameters yielded a motional capacitance $C_X$=1.13 fF, a motional inductance $L_X$=2.21 µH, and an electrical shunt capacitance $C_S$=7.94 fF. A coupling coefficient $k_{\mathit{eff}}^2$=12.4% was found for the resonator by using Eq. (3) and $f_s$ and $f_p$ from the equivalent circuit model in FIGS. 10-11. The measured quality factor in air was slightly lower, 1200, than that measured in vacuum. The measured resonator figure of merit FOM was defined by the IEEE standard (The Institute of Electrical and Electronics Engineers, Inc., "An American National Standard: IEEE Standard on Piezoelectricity," IEEE (New York, N.Y.), 1988, p. 51):

$$FOM = \frac{k_{\mathit{eff}}^2 Q}{1 - k_{\mathit{eff}}^2} = K^2 Q. \quad (8)$$

The measured resonator figure of merit FOM=185 is among the highest recorded for a Lamb wave resonator.

Figure 11:
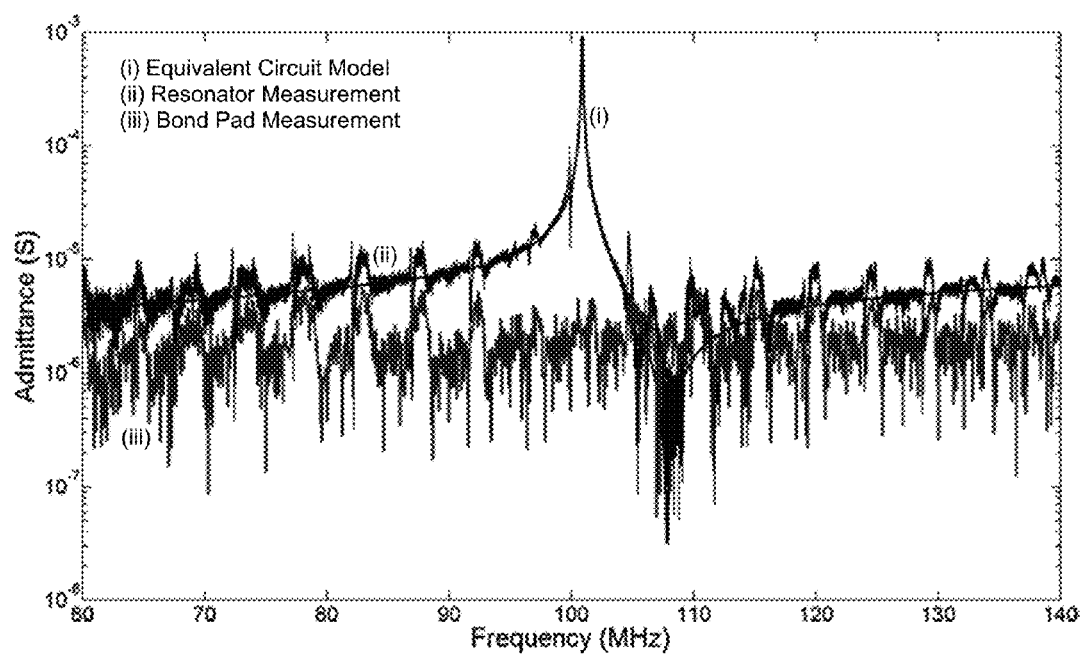
FIG. 11 shows measured wide band admittance (black line ii) of the SH0 lamb wave LiNbO₃ microresonator rotated 80° from the z-axis (170° from they-axis) shown in FIG. 4A. Line (i) shows the admittance of the electrical equivalent circuit model in FIG. 12 with a frequency of 100.965 Mhz, a motional impedance of 1076Ω, a quality factor of 1300, and a $k_t^2$ of 17.5%. Line (iii) shows the measured response between two bond pads rotated 170° from the y-axis, verifying that transduction from the bond pads is the source of many of the spurious modes seen in the resonator response.
Figure 12:
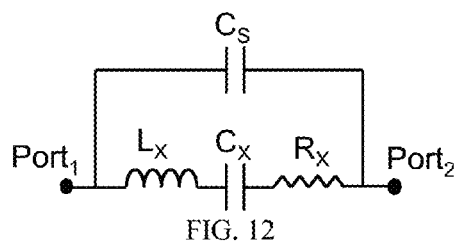
FIG. 12 shows a Butterworth-Van Dyke equivalent circuit model of an acoustic resonator.

Numerous spurious resonances with a frequency spacing of approximately 4.8 MHz were seen in the wideband microresonator response (FIG. 11). These resonances arose from overtone resonances transduced by the bond pads. Also shown is the measured response between two bond pads rotated 170° to the y-axis (gray line, FIG. 11). These bond pads have a membrane without electrodes placed between the pads to mimic the pad feed through of the microresonator device as closely as possible. The frequencies of the numerous spurious resonances between the bond pads corresponded directly to the spurious modes seen for the microresonator device in FIG. 11. We note here that rotating the bond pads to angles with low coupling can eliminate these resonant modes by preventing their transduction. We also note that no extraction of bond pad or any other parasitics were performed in this work.

Figure 13:
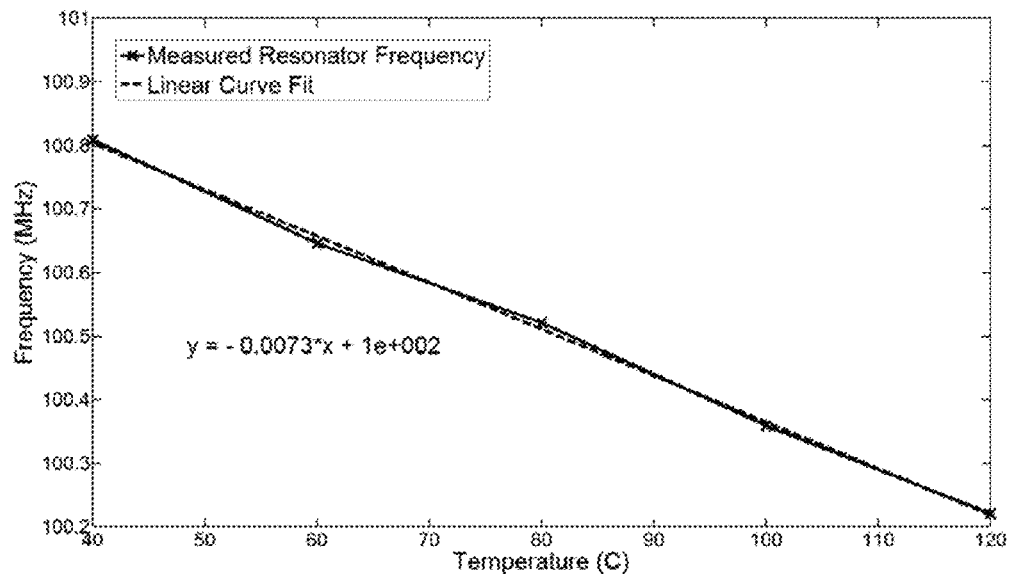
FIG. 13 shows measured resonant frequency versus temperature for the $LiNbO_3$ microresonator shown in FIG. 4A.

Resonant frequency was measured as a function of temperature. The SH0 Lamb wave LiNbO$_3$ resonator shown in FIG. 4A was measured from 40° C. to 100° C. in 20° C. increments (FIG. 13). From these data, a linear temperature coefficient of frequency of −73 parts-per-million per ° C. (ppm/° C.) was determined for the LiNbO$_3$ microresonators with the highest $k_{\mathit{eff}}^2$ with acoustic propagation 80° from the z-axis.

Figure 10:
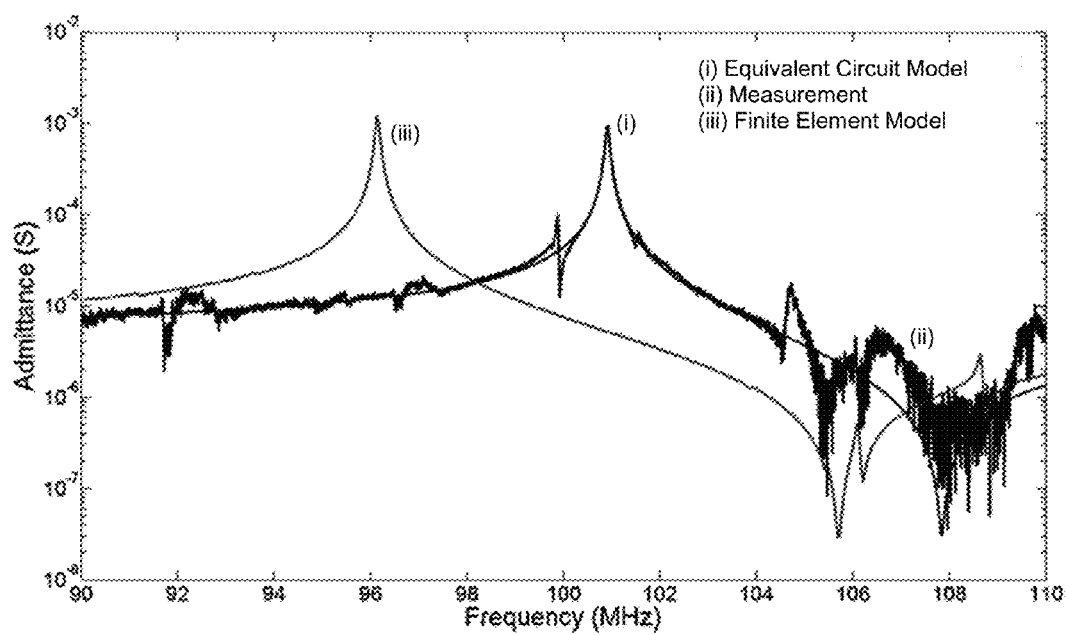
FIG. 10 shows measured narrow band admittance (black line ii) of the SH0 lamb wave LiNbO₃ microresonator rotated 80° from the z-axis (170° from they-axis) shown in FIG. 4A. Line (i) shows the admittance of the electrical equivalent circuit model in FIG. 12 with a frequency of 100.965 Mhz, a motional impedance of 1076Ω, a quality factor of 1300, and a $k_t^2$ of 17.5%. Line (iii) shows the predicted resonator admittance from finite element modeling.

Also shown in FIG. 10 is the predicted admittance from an ANSYS finite element harmonic analysis for the SH0 Lamb wave resonator shown in FIG. 4A. In the analysis, the resonator quality factor was set to the measured value of 1300. A 5 µm thick layer of vacuum was included above the resonator in the finite element analysis to account for any reduction in $k_{\mathit{eff}}^2$. The finite element model is in good general agreement with the measured LiNbO$_3$ microresonator response. The measured resonant frequency was slightly higher than that predicted by FEM. This can be attributed to a slightly narrower plate width because the device reported in FIG. 10 did not include the Au protection layer to prevent etching of the −z LiNbO$_3$ crystal face during release. While the measured $k_{\mathit{eff}}^2$ of 12.4% is lower than the $k_{\mathit{eff}}^2$ of 17.3% predicted by fitting the equivalent circuit in FIG. 12 to the output of the finite element model, it is still among the largest values reported for a Lamb wave resonator.

Figure 14:
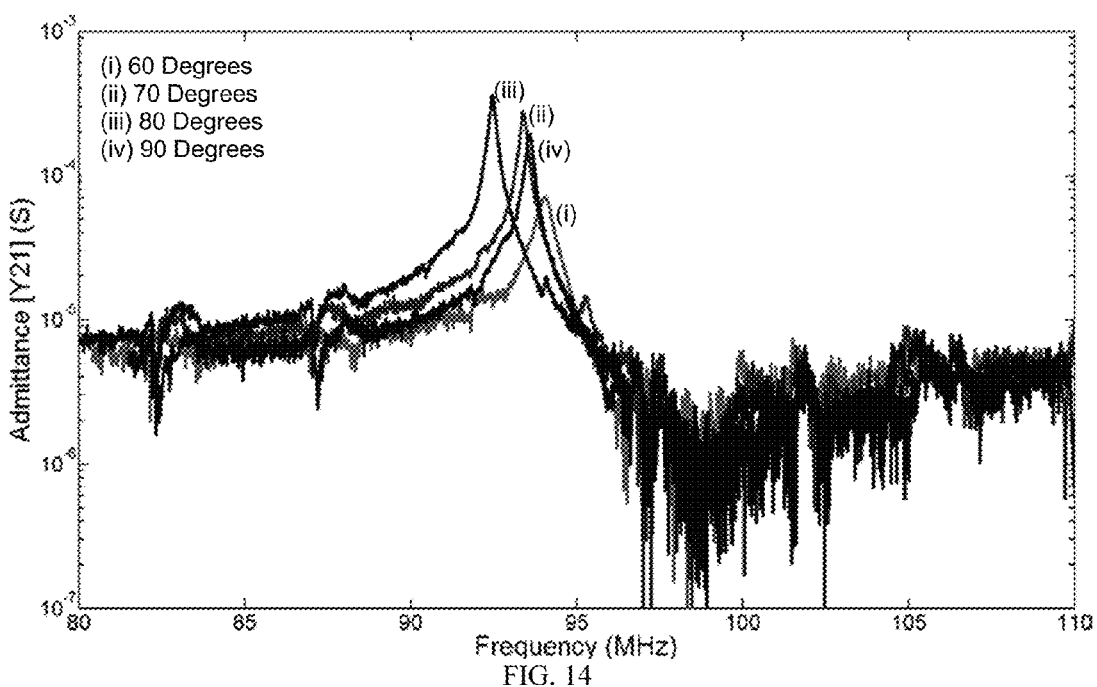
FIG. 14 shows measured admittance of $LiNbO_3$ SH0 Lamb wave resonators with acoustic propagation rotated (i) 60°, (ii) 70°, (iii) 80°, and (iii) 90° from the z-axis (i.e., rotated (i) 150°, (ii) 160°, (iii) 170°, and (iii) 180° from they-axis, respectively). The higher $k_{eff}^2$ of the 80° rotated sample is clearly visible from the measured admittances.

Samples with acoustic propagation 60°, 70°, 80°, and 90° from the z-axis were fabricated using the fabrication process described in FIG. 3C with the −z face Au protection layer as shown in FIG. 5B. The measured admittances in air for these samples are shown in FIG. 14. Each measurement was fit to the electrical equivalent circuit model in FIG. 12, as described above, in order to determine the $k_{\mathit{eff}}^2$ of each sample.

The highest $k_{\mathit{eff}}^2$ of 10.9% was found for the 80° sample with measured $k_{\mathit{eff}}^2$ values of 10.1%, 8.7%, and 6.6% for the 90°, 70°, and 60° rotated samples, respectively. The trend of $k_{\mathit{eff}}^2$ versus acoustic propagation direction is in agreement with our own finite element modeling and the theoretical analysis in Kuznetsova I E et al., *IEEE Trans. Ultrason. Ferroelect. Freq. Contr.* 2001 January; 48(1):322-8.

The Q and $k_{\mathit{eff}}^2$ source for the sample with Au −z face protection were not as high as the sample reported without it. This, however, was sample specific and is not a result of the −z face protection itself. We routinely yielded samples with comparable performance to the device measurement in FIG. 10 using the Au −z face protection. The sample for comparing $k_{\mathit{eff}}^2$ versus acoustic propagation direction was chosen because all four device orientations were relatively spur free, allowing direct comparison of the $k_{\mathit{eff}}^2$ on a single sample.

The measured resonant frequency of 92.5 MHz for the 80° rotated sample yielded an acoustic velocity for the SH0 Lamb wave with 100 nm Cr electrodes of 3700 m/s. The measured resonant frequencies 92.48 MHz (80° rotated sample with −z face protection) and 100.965 MHz (without −z face protection) predict a final plate width of 18.32 µm for the 80° rotated samples released without −z face protection. The characteristics of all the samples studied in this work are summarized in Table 3.

TABLE 3

Summary of LiNbO$_3$ microresonator measured performance

| Acoustic propagation direction refereed to the z-axis | Acoustic propagation direction refereed to the y-axis | −z Face protection utilized during release | Center frequency (MHz) | Motional impedance ($R_X$) | Quality factor (Q) | Coupling coefficient $k_{\mathit{eff}}^2$ (%) | Figure of Merit ($K^2Q$) |
|---|---|---|---|---|---|---|---|
| 80° | 170° | No | 101.965 | 1076 | 1300 | 12.4 | 185 |
| 80° | 170° | Yes | 92.5 | 2700 | 525 | 10.9 | 64 |
| 70° | 160° | Yes | 93.44 | 3600 | 510 | 8.7 | 44 |
| 90° | 180° | Yes | 93.63 | 5000 | 450 | 10.1 | 46 |
| 60° | 150° | Yes | 94.11 | 14500 | 209 | 6.6 | 14 |

In conclusion, we have presented high coupling coefficient SH0 Lamb wave microresonators realized in thin plates of X-cut LiNbO$_3$. The present fabrication process eliminated the challenging wafer bonding, polishing, and splitting steps required to realize the S0 Lamb wave LiNbO$_3$ devices presented in previous works. The highest coupling coefficient was found for resonators with acoustic propagation rotated 80° from the z-axis, which is in agreement with the theory reported in Kuznetsova I E et al., *IEEE Trans. Ultrason. Ferroelect. Freq. Contr.* 2001 January; 48(1):322-8.

In order to apply this promising technology to RF filtering applications, the device resonant frequency can be scaled to between 700 MHz and 2.4 GHz to cover the most widely utilized commercial RF bands. To reach frequencies as high as 2.4 GHz while maintaining a thickness to wavelength ratio <0.25λ required for high coupling coefficient and low dispersion, the device thickness for an SH0 mode resonator could be scaled to approximately 0.5 µm using the methods described herein.

In addition to scaling the resonant frequency, to realize 50Ω matched, band select filters, the resonator motional impedance must be scaled to on order of 1Ω. Fortunately, when scaling to higher frequencies, the motional impedance per unit area will decrease by $1/f_s^2$ source assuming the $k_{eff}^2$ and Q values remain constant. Any additional scaling of the impedance can be achieved by increasing the electrode overlap a, arraying resonators in parallel, or increasing the number of electrode fingers. Because both the width of the electrode fingers and the resonator motional impedance will be decreasing with increasing device resonant frequency, replacing the Cr electrodes with a lower resistivity metal (e.g., any described herein) will be important to prevent degrading the device Q with the series resistance of the electrodes. With the ability to realize many high $k_{eff}^2$ and high Q micromechanical resonators operating at different frequencies on a single chip, single chip filtering solutions covering many cellular bands will become possible, promising to reduce the number of filter chips required in next generation cellular handsets.

Example 2

Lamb Wave S0 and SH0 Micromechanical Resonators Formed in Thin Plates of Lithium Niobate Microresonator filter arrays have been studied as a smaller, more highly integrated replacement for the numerous filters dies that currently reside in the RF front-end of a multi-band cellular handset. In particular, microresonators realized in thin films of lithium niobate (LiNbO$_3$) have demonstrated the high piezoelectric coupling needed to realize band select filters with percent bandwidths of 2-5%, while simultaneously exhibiting the high quality factors required for duplexers with narrow frequency gaps between the transmit and receive bands (Gong S et al., *IEEE Trans. Microwave Theory Tech.* 2013 January; 61(1):403-14; Wang R et al., *Proc. 2013 IEEE 26th Int'l Conf. Micro Electro Mechanical Systems (MEMS)*, held 20-24 Jan. 2013 in Taipei, Taiwan, pp. 165-8; and Olsson III R H et al., "A high electromechanical coupling coefficient SH0 Lamb wave lithium niobate micromechanical resonator and a method for fabrication," *Sens. Actuat. A* 2014 March; 209:183-9).

As described herein, we studied and compared the properties of Lamb wave resonators vibrating in the fundamental symmetric (S0) and shear (SH0) modes. These modes were chosen because they are predicted to have both low dispersion and high coupling coefficient over a wide range of thickness-to-wavelength ratios (h/λ). Both of these properties are important for realizing multi-frequency band select filters in a single LiNbO$_3$ layer.

Fundamental mode bar resonators were realized on a single die for direct comparison. These resonators included a plate width W=20 µm, a plate thickness t=1.5 µm, various apertures a (i.e., a=50 µm, 90 µm, and 130 µm) and various acoustic wave propagations (i.e., rotated 30° (S0) and 170° (SH0) to the +y-axis to maximize piezoelectric coupling). The h/λ of 0.04 is very close to the optimum value to maximize piezoelectric coupling of 0.05 found for both the S0 and SH0 modes in Kuznetsova I E et al., *IEEE Trans. Ultrason. Ferroelect. Freq. Contr.* 2001 January; 48(1):322-8.

We found that while the S0 Lamb wave had a 1.6 times higher sound velocity than the SH0 mode (compare ~6400 m/s for S0 and ~3900 m/s for SH0), the SH0 mode was predicted to and consistently exhibited a 1.6-1.8 times higher effective piezoelectric coupling coefficient $k_{eff}^2$. The SH0 mode also exhibited higher quality factor Q, higher figure-of-merit FOM, and fewer spurious responses.

Finally, a fundamental SH0 mode Lamb wave resonator realized in a 4.4 µm wide plate was demonstrated with an operating frequency of 350 MHz, a $k_{eff}^2$=14.5%, Q=2150 in air, and a FOM=365, among the highest reported for Lamb wave resonators. Details follow.

Device Fabrication: The resonators were fabricated using a process flow similar to that shown in FIG. 3, where selective ion irradiation of a LiNbO$_3$ wafer created a damaged release layer that selectively etches in HF chemistry, allowing suspended membranes to be formed. The advantages of this fabrication process include the following: 1) the ability to lithographically define the undercut of the device, 2) no wafer bonding, polishing or fracturing, and 3) the ability to realize custom and potentially multiple LiNbO$_3$ thicknesses on a single substrate.

The process began with an X-cut LiNbO$_3$ wafer upon which a 100 nm layer of Cr was deposited and patterned to form alignment marks. Next, a SiO$_2$ layer was deposited and patterned to determine where the release layer will be formed via ion irradiation. The sample was then implanted with a He dose of 1×10$^{16}$ atoms/cm$^3$ at an energy of 0.9 MeV to create an ion damaged release layer of LiNbO$_3$ approximately 2 µm below the wafer surface. This energy was found to give a final plate thickness after release of approximately 1.5 µm. The implants were performed in a 3 MV NEC Pelletron using a current of <7 µA. A low sample temperature was maintained via liquid nitrogen cooling using a Cu braid during implantation. The ion implant was intentionally performed through the Cr electrode layer to promote adhesion. After ion implantation, the SiO$_2$ implant masking layer was stripped, and the LiNbO$_3$ was patterned using an oxide hard mask and Cl dry etching to define the final plate dimensions.

Next, the Cr electrodes were patterned, and a layer of Au was deposited and patterned via lift off to protect the −z face of the LiNbO$_3$ device, which can have a significant etch rate in HF during the release. During our research, we found that the structural rigidity of this Au protection layer also led to significantly improved device yield through the release process. Finally, the devices were released in a HF based chemistry and the Au protect layer is stripped in KI—I$_2$.

Device Structure and Dimensions: The resonator included a 1.5 µm thick suspended membrane of LiNbO$_3$ with a width W=20 µm. The device was designed to resonate in the fundamental S0 or SH0 mode, see FIG. 15, with a resonant frequency $f_s=c/2W$, where c is the sound velocity of the Lamb wave. The thickness-to-wavelength ratio $t/\lambda=0.04$ was close to the optimum value to maximize $k_{eff}^2$ of 0.05 (Kuznetsova I E et al., *IEEE Trans. Ultrason. Ferroelect. Freq. Contr.* 2001 January; 48(1):322-8). The space between the electrodes and device substrate anchor s was 45 μm for all devices. While it was found in Wang R et al., *Proc. 2013 IEEE 26th Int'l Conf. Micro Electro Mechanical Systems (MEMS)*, held 20-24 Jan. 2013 in Taipei, Taiwan, pp. 165-8 and Olsson III R H et al., *Sens. Actuat. A* 2014 March; 209:183-90 that to maximize $k_{eff}^2$ the electrodes should be placed at the edges of the resonator, 5 μm wide electrodes with a gap g=5 μm were designed slightly offset from the resonator edge for ease of fabrication. Electrode apertures a, which define the resonator static capacitance, of 50 μm, 90 μm, and 130 μm were modeled, fabricated, and characterized.

Finite Element Modeling Results: The six devices with three different apertures and two different rotations to the +y-axis described above were studied using finite element modeling (FEM) and experimentally. The FEM was a full 3D representation of the device including the anchors and electrodes.

Figure 15:
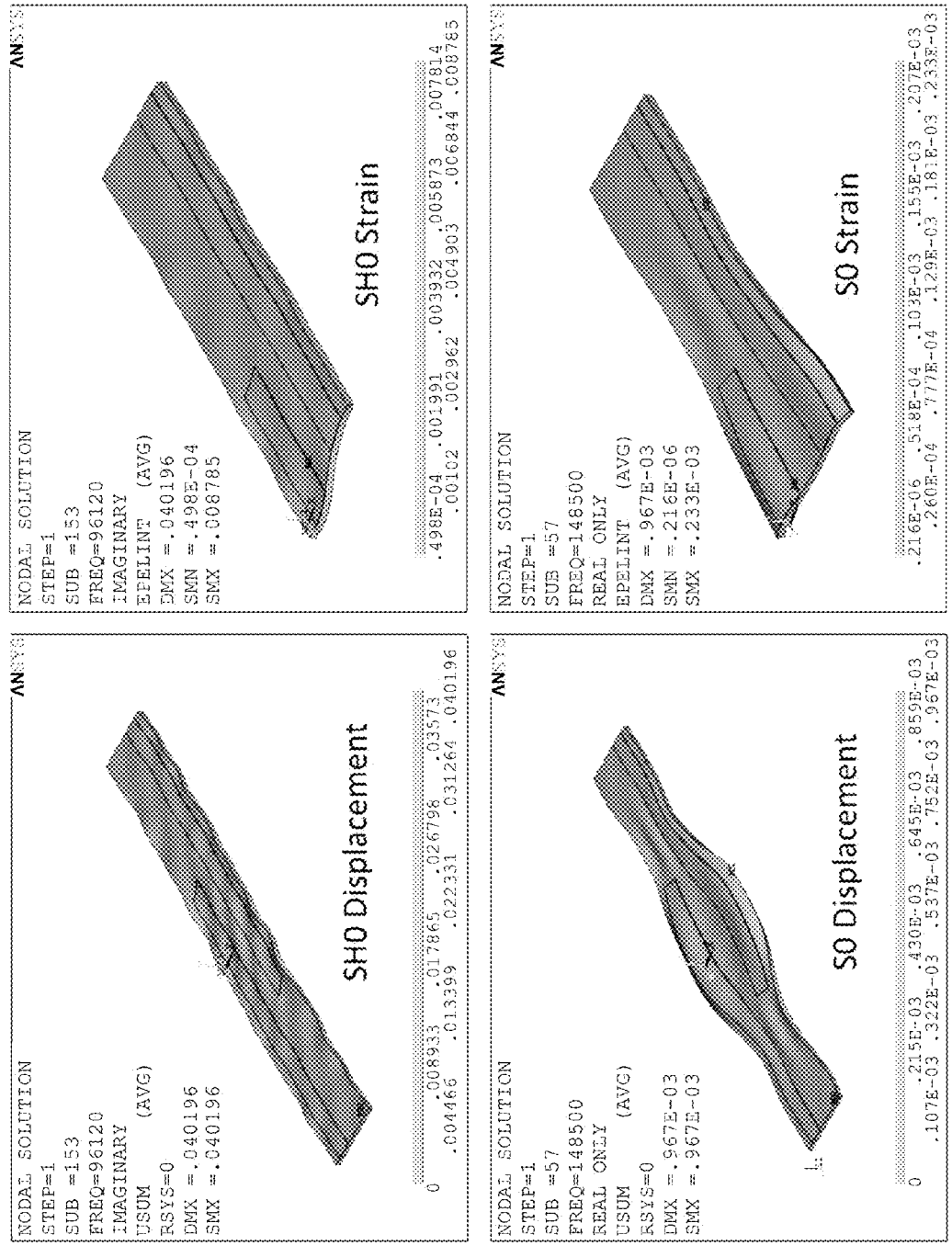
FIG. 15 is a FEM showing displacement (Full) and strain (Half) profiles of the S0 and SH0 resonator modes for a microresonator having an aperture a=50 μm.

FIG. 15 shows the displacement and strain profiles from ANSYS FEM for the S0 Lamb wave resonator rotated 30° to the +y-axis and for the SH0 Lamb wave resonator rotated 170° (SH0) to the +y-axis, both with aperture a=50 μm. The maximum strain appeared between the Cr electrodes and was thus efficiently transduced by the electric field applied across these same electrodes. The strain between the electrodes at the edges of the aperture for the S0 Lamb wave resonator was seen to dramatically decrease, indicating that the S0 Lamb wave $k_{eff}^2$ will be significantly impacted by the device aperture. The $k_{eff}^2$ for each device was studied using harmonic analysis in ANSYS.

The piezoelectric coupling $K^2$ was calculated from the simulated resonator admittance using Eq. 9:

$$K^2 = \frac{1}{2\pi f_s Q R_x C_S} \qquad (9)$$

$$K = \frac{1}{2\pi f_s Q R_x C_S}$$

$$K^2 = \frac{1}{2\pi f_s Q R_x C_S},$$

where $f_s$ is the frequency of minimum resonator admittance, $R_X$ is the resonator motional impedance, $C_S$ is the resonator static capacitance, and Q is the resonator quality factor, which is an input to the FEM. The effective piezoelectric coupling $k_{eff}^2$ was then calculated using Eq. 4:

$$k_{eff}^2 = \frac{K^2}{1+K^2} \qquad (4)$$

$$k_{eff}^2 = \frac{K}{1+K}.$$

In Example 1, $k_{eff}^2$ was calculated from the simulated resonator admittance using Eq. 3:

$$k_{eff}^2 = \frac{f_p^2 - f_s^2}{f_p^2}, \qquad (3)$$

where $f_p$ is the frequency of maximum resonator admittance.

The results of Eqs. 3 and 4 were equal when no spurious resonances are seen near $f_s$ or $f_p$. As discussed in this Example, however, we found in both FEM and in experiments that spurious modes caused a significant increase in $f_p$ and overestimation of $k_{eff}^2$ if Eq. 3 is used. We note here that the piezoelectric coupling coefficient $k_t^2$ reported in Gong S et al., *IEEE Trans. Microwave Theory Tech.* 2013 January; 61(1):403-14 is equal to Eq. 10:

$$k_t^2 = \frac{\pi^2}{8} \qquad (10)$$

$$\frac{C_X}{C_S} = \frac{\pi^2}{8}$$

$$K^2 = \frac{\pi^2}{8} \frac{k_{eff}^2}{1-k_{eff}^2}.$$

Figure 16:
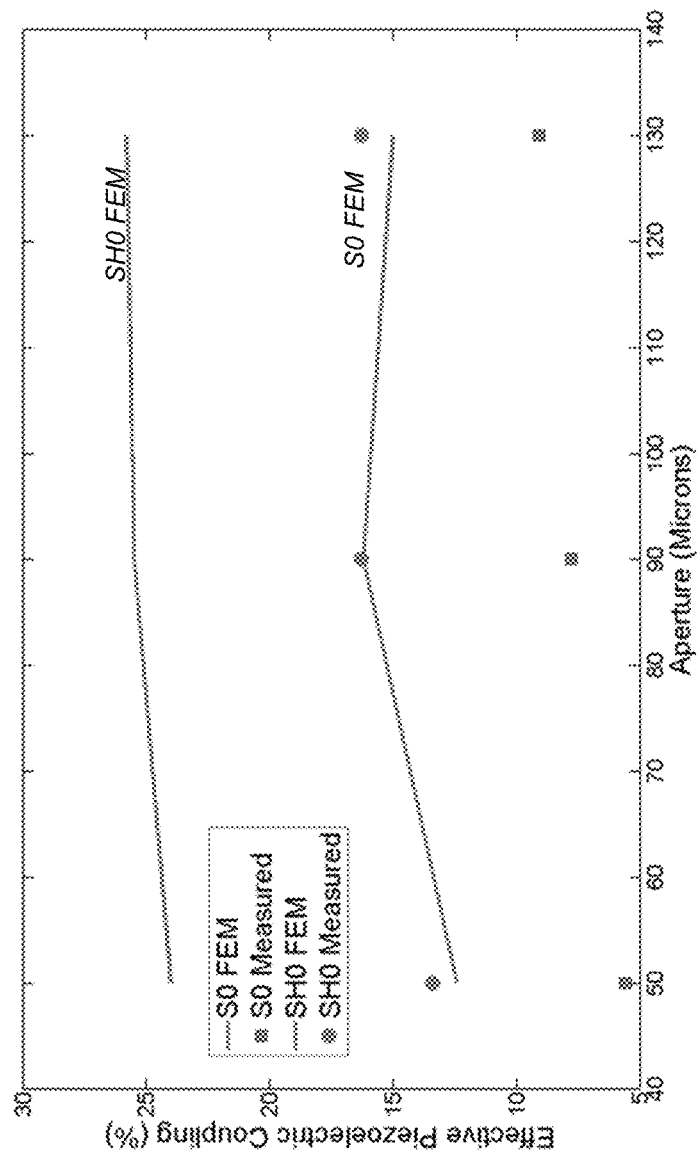
FIG. 16 is a graph showing FEM and experimental $k_{eff}^2$ versus aperture.

The simulated $k_{eff}^2$ versus aperture is shown in FIG. 16 and summarized in Table 4 for both the S0 and SH0 Lamb wave resonators. The S0 Lamb wave resonator was predicted to have a significantly lower $k_{eff}^2$ that is much more sensitive to the aperture than the SH0 Lamb wave resonator.

Figure 17:
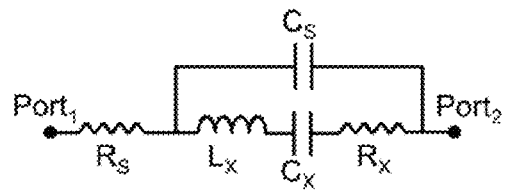
FIG. 17 shows a modified Butterworth-Van Dyke equivalent circuit model of an acoustic resonator.
Figure 18:
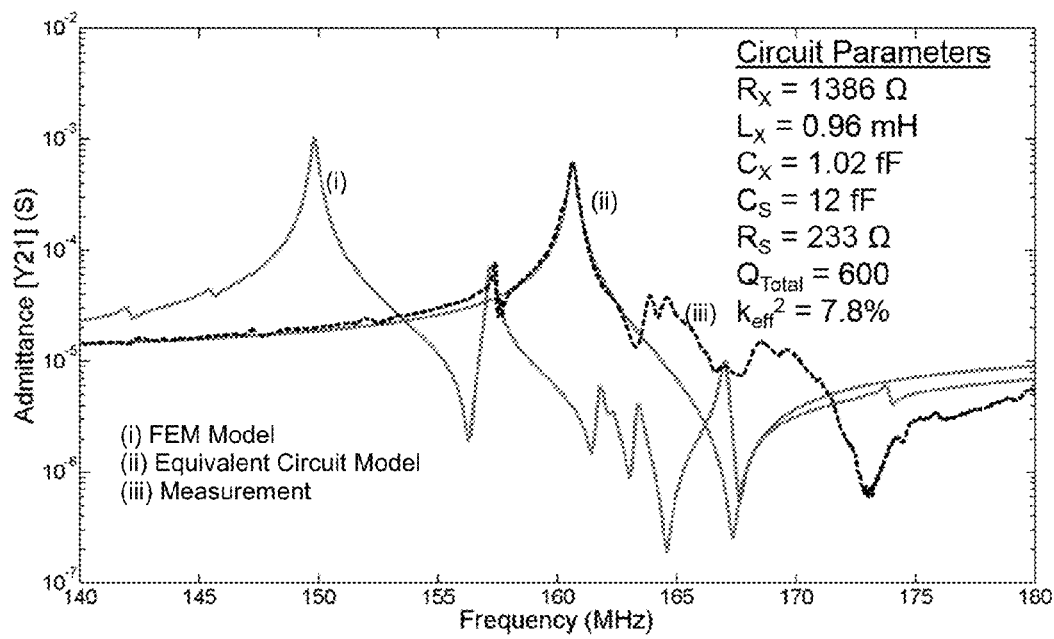
FIG. 18 shows FEM and experimental results for the S0 Lamb wave resonator with an aperture a=90 μm.
Figure 19:
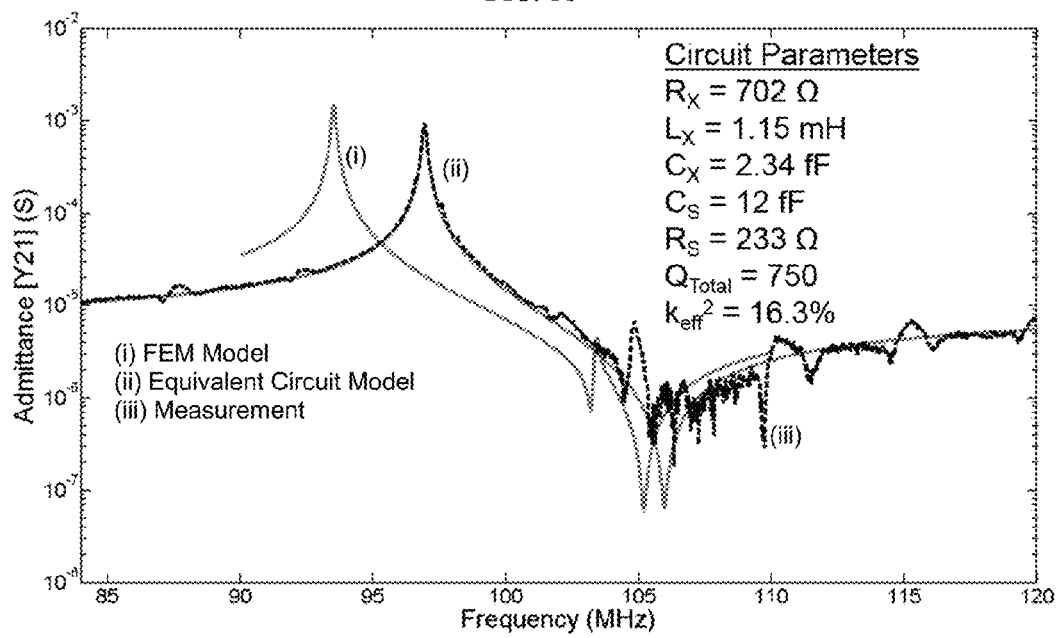
FIG. 19 shows FEM and experimental results for the SH0 Lamb wave resonator with an aperture a=90 μm.

Experimental Results: The admittance of the six different resonators realized on the same die was measured in air using a network analyzer. The responses for the S0 and SH0 mode resonators with an aperture of 90 μm are shown in FIG. 18 (S0) and in FIG. 19 (SH0). Also shown in FIGS. 18-19 are the results of the FEM for each device simulated with the measured quality factors. Each resonator measurement was fit to the modified Butterworth Van Dyke (MBVD) equivalent circuit model shown in FIG. 17 using Eqs. 11-13:

$$R_X = \frac{1}{2\pi f_s C_S K^2 Q_A}, \qquad (11)$$

$$C_X = \frac{C_S}{K^2}, \text{ and} \qquad (12)$$

$$L_X = \frac{R_x Q_A}{2\pi f_s} = \frac{(R_x + R_S)Q_{Total}}{2\pi f_s}, \qquad (13)$$

where $C_X$ and $L_X$ are the motional capacitance and inductance, $R_S$ is the series electrical resistance, $Q_A$ is the acoustic quality factor, and $Q_{Total}$ is the measured 3 dB bandwidth of the acoustic admittance divided by $f_s$, which includes the losses from both $R_X$ and $R_S$. $R_S$ was measured directly on a separate test structure allowing it to be extracted from $R_X$. The simulated response of the MBVD electrical equivalent circuit model for the S0 and SH0 mode micromechanical resonators with an aperture of 90 μm are shown in FIGS. 18-19 along with the equivalent circuit parameters.

The simulated MBVD results and experimental measurements were in good agreement far from resonance and close to the series resonance. The experimental $k_{eff}^2$ for each resonator was calculated from the MBVD equivalent circuit model using either Eq. 3 or 4, which yielded identical results since no spurious responses are modeled using the circuit in FIG. 17. From FIG. 18, it is apparent that using the measured frequency of maximum admittance in Eq. 3 dramatically overestimated $k_{eff}^2$ due to the spurious modes between $f_s$ and $f_p$.

The measured $f_s$, $R_S$, $R_X$, $C_S$, $k_{eff}^2$, $k_t^2$, $Q_{Total}$, $Q_A$, and acoustic figure-of-merit are summarized for all the resonators in Table 4, while the measured $k_{eff}^2$ versus aperture is shown in FIG. 16. The SH0 resonators were found to have significantly higher effective piezoelectric coupling coefficient and figure of merit values.

fabricated using a newly developed process that allows the formation of a damaged $LiNbO_3$ sacrificial layer using helium ion implantation. This damaged $LiNbO_3$ was subsequently etched in a HF acid based wet release. The plate width, which determines the resonant frequency, was 20 μm wide for both the S0 and SH0 mode resonators, and the thickness-to-wavelength ratio for both types of resonators was 0.04, near the optimum value to maximize piezoelectric coupling found in Kuznetsova I E et al., *IEEE Trans. Ultrason. Ferroelect. Freq. Contr.* 2001 January; 48(1):322-8. The acoustic wave propagation was rotated 30° (S0) and

TABLE 4

Experimental and FEM results for the S0 and SH0 Lamb wave microresonators

| Mode | Orientation to +y-axis | a (μm) | Freq. (MHz) | $R_S$ (Ω) | $R_X$ (Ω) | $C_S$ (fF) | FEM $k_{eff}^2$ (%) | Measured $k_{eff}^2$ (%) | Measured $k_t^2$ (%) | $Q_{Total}$ | $Q_A$ | FOM* |
|---|---|---|---|---|---|---|---|---|---|---|---|---|
| S0 | 30° | 50 | 158.9 | 194 | 3516 | 9 | 12.4 | 5.6 | 7.4 | 500 | 528 | 31 |
| S0 | 30° | 90 | 160.6 | 233 | 1386 | 12 | 16.2 | 7.8 | 10.5 | 600 | 701 | 59 |
| S0 | 30° | 130 | 161.5 | 272 | 944 | 18 | 15.0 | 9.1 | 12.3 | 450 | 580 | 58 |
| SH0 | 170° | 50 | 98.4 | 194 | 922 | 8.5 | 24.0 | 13.4 | 19.1 | 1100 | 1331 | 206 |
| SH0 | 170° | 90 | 96.9 | 233 | 702 | 12 | 25.5 | 16.3 | 24.1 | 750 | 999 | 195 |
| SH0 | 170° | 130 | 94.8 | 272 | 783 | 17 | 25.8 | 16.3 | 24.1 | 480 | 647 | 126 |

*$k_{eff}^2 Q_A / (1 - k_{eff}^2)$

Scaling to Higher Frequencies: From Table 4, the resistance of the Cr electrodes was seen to significantly degrade the total resonator quality factor. Higher frequency operation can only result in further degradation in $Q_{Total}$ as the electrode cross sectional area will decrease, causing $R_S$ to increase and $R_X$ to decrease (see Eq. 11). For this reason, when scaling to higher operating frequencies, the Cr electrodes were replaced with 100 nm of Au (lower resistivity compared to Cr), and the Au −z face protection mask step was omitted from the fabrication process.

Figure 20A:
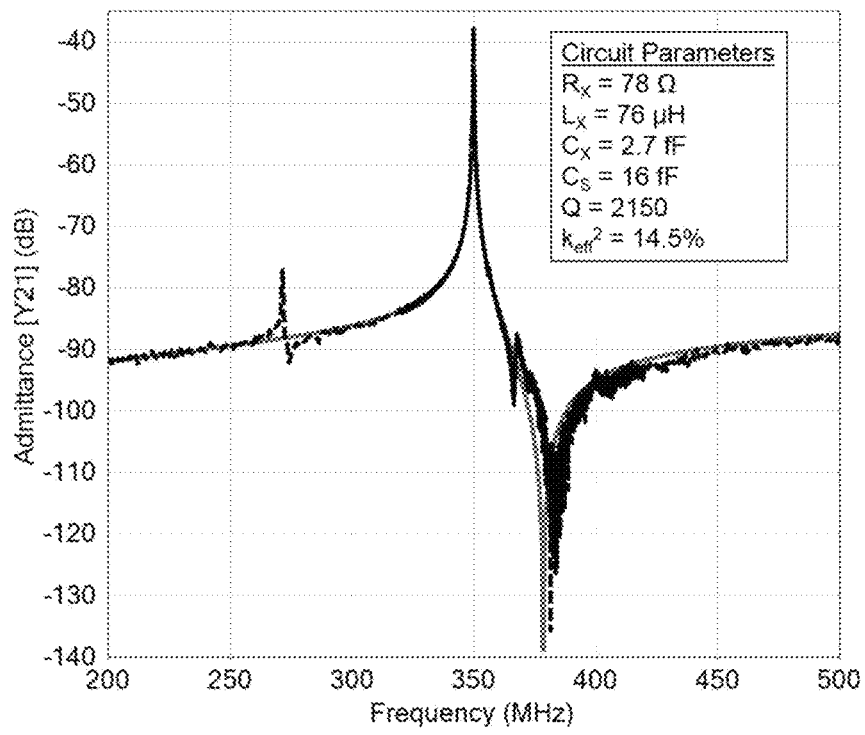
FIG. 20A-20B shows experimental (black) and equivalent circuit model (gray) admittance for a SH0 Lamb wave resonator with a plate width W=4.4 μm.
Figure 20B:
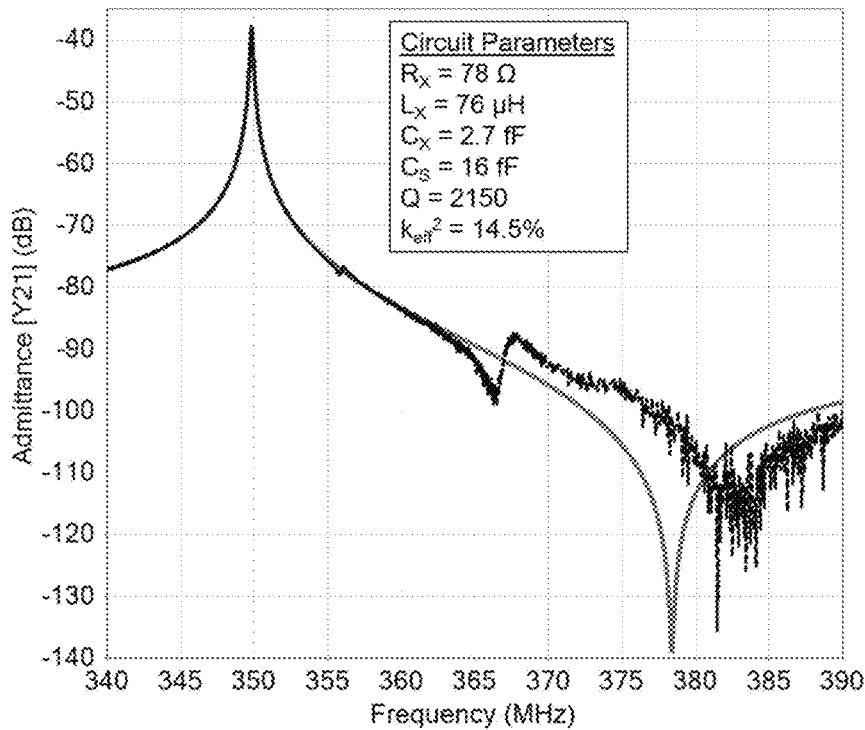

The measured admittance of a SH0 Lamb wave resonator rotated 170° to the +y-axis with a plate width W=4.4 μm, an aperture a=60 μm, an electrode width e=1 μm, and a gap between the electrodes g=2 μm, is shown in FIG. 20A-20B. Also shown in both figures is the simulated response of the MBVD equivalent circuit. The narrowing of the plate width W to 4.4 μm increased the series resonant frequency to 350 MHz. The inclusion of the Au electrodes has reduced the series electrical resistance to the point where it need not be modeled, $R_S$=0Ω and $Q_A$=$Q_{Total}$. The increase in the effective electrode aperture to nearly seven wavelengths has enabled a corresponding increase in the device quality factor to 2150. The ultra-high frequency (UHF) band resonator maintained a high effective coupling coefficient $k_{eff}^2$=14.5% and a figure of merit FOM=365. The performance of the UHF, fundamental SH0 mode $LiNbO_3$ micromechanical resonator is summarized in Table 5.

170° (SH0) to the +y-axis for the resonators, also an optimum condition to maximize piezoelectric coupling.

We found that the SH0 mode microresonators consistently exhibited higher effective piezoelectric coupling, quality factor, and figure of merit when compared to identically designed S0 mode structures. The properties of the SH0 mode resonators were less sensitive to the device aperture and the SH0 mode resonators exhibited fewer spurious responses. While the initial study was performed on $LiNbO_3$ microresonators operating at 97 MHz (SH0) and 160 MHz (S0), a SH0 mode microresonator in a 4.4 μm wide $LiNbO_3$ plate were demonstrated at 350 MHz. The $k_{eff}^2$=14.5%, Q=2150, and FOM=365 for the 350 MHz microresonator are among the highest demonstrated for this new class of resonant microdevices.

Other Embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is

TABLE 5

Experimental results for a SH0 Lamb wave resonator operating in UHF band

| Mode | Orientation to +y-axis | Plate Width W (μm) | Aperture a (μm) | Freq. (MHz) | $R_X$ (Ω) | $C_S$ (fF) | Measured $k_{eff}^2$ (%) | Measured $k_t^2$ (%) | Q | TFOM $k_{eff}^2 Q / (1 - k_{eff}^2)$ |
|---|---|---|---|---|---|---|---|---|---|---|
| SH0 | 170° | 4.4 | 64 | 350 | 78 | 16 | 14.5 | 21 | 2150 | 365 |

Conclusion: We have studied, theoretically and experimentally, fundamental mode S0 and SH0 Lamb wave resonators realized in thin plates of $LiNbO_3$. The devices were intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A single crystal micromechanical resonator comprising:
   a resonating portion comprising a single X-cut or Y-cut crystal of lithium niobate or lithium tantalate;
   a support structure disposed below the resonating portion, wherein the resonating portion and the support structure are composed of the same single X-cut or Y-cut crystal; and
   a plurality of anchoring regions configured to suspend the resonating portion within the support structure, wherein a trench is disposed below and around the resonating portion.

2. The micromechanical resonator of claim 1, wherein the plurality of anchoring regions, resonating portion, and the support structure are composed of the same single X-cut or Y-cut crystal.

3. The micromechanical resonator of claim 2, further comprising a plurality of electrodes disposed on a surface of the resonating portion.

4. The micromechanical resonator of claim 3, wherein the resonating portion comprises a suspended plate.

5. A die comprising a plurality of single crystal micromechanical resonators of claim 1, wherein two or more resonators are the same or different.

6. A band select filter array comprising a plurality of single crystal micromechanical resonators of claim 1, wherein two or more resonators are the same or different.

* * * * *